(12) United States Patent
Kim et al.

(10) Patent No.: US 8,981,574 B2
(45) Date of Patent: Mar. 17, 2015

(54) SEMICONDUCTOR PACKAGE

(71) Applicants: Kilsoo Kim, Hwaseong-si (KR); SunWon Kang, Seongnam-si (KR)

(72) Inventors: Kilsoo Kim, Hwaseong-si (KR); SunWon Kang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/064,110

(22) Filed: Oct. 25, 2013

(65) Prior Publication Data

US 2014/0175673 A1 Jun. 26, 2014

(30) Foreign Application Priority Data

Dec. 20, 2012 (KR) .................. 10-2012-0149602

(51) Int. Cl.
*H01L 29/15* (2006.01)
*H01L 25/065* (2006.01)
(Continued)

(52) U.S. Cl.
CPC ............ *H01L 25/0657* (2013.01); *H01L 24/24* (2013.01); *H01L 24/73* (2013.01); *H01L 24/06* (2013.01); *H01L 25/0652* (2013.01); *H01L 2224/16145* (2013.01); *H01L 2224/24145* (2013.01); *H01L 2224/32145* (2013.01); *H01L 2224/32225* (2013.01); *H01L 2224/48091* (2013.01); *H01L 2224/48145* (2013.01); *H01L 2224/4824* (2013.01); *H01L 2224/73207* (2013.01); *H01L 2224/73265* (2013.01); *H01L 2224/73267* (2013.01); *H01L 2924/15311* (2013.01); *H01L 2224/02371* (2013.01); *H01L 2224/17517* (2013.01); *H01L 23/3128* (2013.01); *H01L 24/05* (2013.01); *H01L 24/29* (2013.01); *H01L 24/32* (2013.01); *H01L 24/48* (2013.01); *H01L 2224/02372* (2013.01);
(Continued)

(58) Field of Classification Search
CPC ......... H01L 24/06; H01L 24/24; H01L 24/73; H01L 25/0652; H01L 25/0657; H01L 23/3121; H01L 23/3128; H01L 23/4334; H01L 23/4952; H01L 23/49548; H01L 23/49575; H01L 24/49; H01L 24/91; H01L 25/105; H01L 24/32; H01L 24/83
USPC .......................................... 257/777
See application file for complete search history.

(56) References Cited

U.S. PATENT DOCUMENTS 5,177,594 A 1/1993 Chance et al.
5,200,806 A 4/1993 Sawaya
(Continued)

FOREIGN PATENT DOCUMENTS

JP H06232196 A 8/1994
JP H09186289 A 7/1997
(Continued)

*Primary Examiner* — A. Sefer
(74) *Attorney, Agent, or Firm* — Renaissance IP Law Group LLP

(57) ABSTRACT

A semiconductor package is provided comprising a package substrate having an opening located in a central region thereof and a circuit pattern provided adjacent to the opening. A first semiconductor chip is located on the package substrate and includes first bonding pads. A pair of second semiconductor chips are spaced apart from each other across the opening and mounted between the package substrate and the first semiconductor chip. Each of the second semiconductor chips includes a second bonding pad. A connection element is further provided to electrically connect the second bonding pad to a corresponding one of the first bonding pads.

13 Claims, 30 Drawing Sheets

(51) Int. Cl.
*H01L 23/00* (2006.01)
*H01L 23/31* (2006.01)

(52) U.S. Cl.
CPC ........... *H01L 2224/02373* (2013.01); *H01L 2224/0401* (2013.01); *H01L 2224/04042* (2013.01); *H01L 2224/0557* (2013.01); *H01L 2224/06135* (2013.01); *H01L 2224/06136* (2013.01); *H01L 2224/06181* (2013.01); *H01L 2224/06182* (2013.01); *H01L 2224/14181* (2013.01); *H01L 2224/24011* (2013.01); *H01L 2224/245* (2013.01); *H01L 2224/2919* (2013.01); *H01L 2224/29191* (2013.01); *H01L 2224/4813* (2013.01); *H01L 2224/73209* (2013.01); *H01L 2225/0651* (2013.01); *H01L 2225/06517* (2013.01); *H01L 2924/15192* (2013.01); *H01L 2225/06513* (2013.01); *H01L 2225/06506* (2013.01); *H01L 2225/06541* (2013.01); *H01L 2225/06565* (2013.01); *H01L 2225/06524* (2013.01); *H01L 2225/06562* (2013.01)
USPC ..................................................... 257/777

(56) References Cited

U.S. PATENT DOCUMENTS

| | | |
|---|---|---|
| 5,343,366 A | 8/1994 | Cipolla et al. |
| 5,818,107 A | 10/1998 | Pierson et al. |
| 5,838,061 A | 11/1998 | Kim |
| 6,037,666 A | 3/2000 | Tajima |
| 6,133,637 A | 10/2000 | Hikita et al. |
| 6,175,157 B1 | 1/2001 | Morifuji |
| 6,232,668 B1 | 5/2001 | Hikita et al. |
| 6,238,949 B1 | 5/2001 | Nguyen et al. |
| 6,245,595 B1 | 6/2001 | Nguyen et al. |
| 6,285,084 B1 | 9/2001 | Hikita et al. |
| 6,337,579 B1 | 1/2002 | Mochida |
| 6,355,977 B1 | 3/2002 | Nakamura |
| 6,369,407 B1 | 4/2002 | Hikita et al. |
| 6,376,915 B1 | 4/2002 | Hikita et al. |
| 6,396,154 B1 | 5/2002 | Hikita et al. |
| 6,399,419 B1 | 6/2002 | Shibata et al. |
| 6,404,060 B1 | 6/2002 | Hikita et al. |
| 6,424,049 B1 | 7/2002 | Sameshima |
| 6,458,609 B1 | 10/2002 | Hikita et al. |
| 6,459,157 B1 | 10/2002 | Oikawa |
| 6,462,420 B2 | 10/2002 | Hikita et al. |
| 6,476,499 B1 | 11/2002 | Hikita et al. |
| 6,507,117 B1 | 1/2003 | Hikita et al. |
| 6,534,847 B2 | 3/2003 | Hikita et al. |
| 6,555,919 B1 | 4/2003 | Tsai et al. |
| 6,580,169 B2 | 6/2003 | Sakuyama et al. |
| 6,602,735 B2 | 8/2003 | Shyu |
| 6,617,693 B2 | 9/2003 | Hikita et al. |
| 6,627,979 B2 | 9/2003 | Park |
| 6,635,969 B1 | 10/2003 | Nakamura |
| 6,635,970 B2 | 10/2003 | Lasky et al. |
| 6,657,309 B1 | 12/2003 | Hikita et al. |
| 6,661,100 B1 | 12/2003 | Anderson et al. |
| 6,674,173 B1 | 1/2004 | Wang |
| 6,689,637 B2 | 2/2004 | Park |
| 6,703,713 B1 | 3/2004 | Tseng et al. |
| 6,707,140 B1 | 3/2004 | Nguyen et al. |
| 6,717,244 B1 | 4/2004 | Hikita et al. |
| 6,720,662 B1 | 4/2004 | Den |
| 6,780,670 B2 | 8/2004 | Park |
| 6,835,593 B2 | 12/2004 | Shibata |
| 6,838,312 B2 | 1/2005 | Hikita et al. |
| 6,841,870 B2 | 1/2005 | Misumi |
| 6,869,829 B2 | 3/2005 | Hikita et al. |
| 6,870,248 B1 | 3/2005 | Shibata |
| 6,886,076 B1 | 4/2005 | Isodono et al. |
| 6,936,929 B1 | 8/2005 | Mostafazadeh et al. |
| 7,045,386 B2 | 5/2006 | Hikita et al. |
| 7,075,177 B2 | 7/2006 | Oka et al. |
| 7,091,061 B2 | 8/2006 | King et al. |
| 7,098,070 B2 | 8/2006 | Chen et al. |
| 7,126,226 B2 | 10/2006 | Hikita et al. |
| 7,144,800 B2 | 12/2006 | Mostafazadeh et al. |
| 7,157,372 B1 | 1/2007 | Trezza |
| 7,211,885 B2 | 5/2007 | Nordal et al. |
| 7,215,032 B2 | 5/2007 | Trezza |
| 7,224,042 B1 | 5/2007 | Mccollum |
| 7,245,021 B2 | 7/2007 | Vindasius et al. |
| 7,269,897 B2 | 9/2007 | Frezza |
| 7,358,601 B1 | 4/2008 | Plants et al. |
| 7,443,036 B2 | 10/2008 | Iwasaki et al. |
| 7,482,272 B2 | 1/2009 | Trezza |
| 7,489,025 B2 | 2/2009 | Chen et al. |
| 7,521,806 B2 | 4/2009 | Trezza |
| 7,534,722 B2 | 5/2009 | Trezza |
| 7,538,033 B2 | 5/2009 | Trezza |
| 7,560,813 B2 | 7/2009 | Trezza |
| 7,633,143 B1 | 12/2009 | Fan |
| 7,652,368 B2 | 1/2010 | Hayashi et al. |
| 7,659,202 B2 | 2/2010 | Trezza |
| 7,736,949 B2 | 6/2010 | Chen et al. |
| 7,745,258 B2 | 6/2010 | Iwasaki et al. |
| 7,767,493 B2 | 8/2010 | Trezza et al. |
| 7,781,886 B2 | 8/2010 | Trezza et al. |
| 7,785,931 B2 | 8/2010 | Trezza |
| 7,785,987 B2 | 8/2010 | Trezza |
| 7,786,592 B2 | 8/2010 | Trezza |
| 7,808,111 B2 | 10/2010 | Trezza |
| 7,838,997 B2 | 11/2010 | Trezza |
| 7,843,046 B2 | 11/2010 | Andrews, Jr. et al. |
| 7,847,412 B2 | 12/2010 | Trezza |
| 7,851,348 B2 | 12/2010 | Misra et al. |
| 7,859,118 B2 | 12/2010 | Tsai |
| 7,863,092 B1 | 1/2011 | Chaware et al. |
| 7,884,483 B2 | 2/2011 | Trezza et al. |
| 7,919,870 B2 | 4/2011 | Trezza |
| 7,927,919 B1 | 4/2011 | Fan et al. |
| 7,932,584 B2 | 4/2011 | Trezza |
| 7,951,699 B2 | 5/2011 | Iwasaki et al. |
| 7,969,015 B2 | 6/2011 | Trezza |
| 7,986,044 B2 | 7/2011 | Mcconnell |
| 7,989,958 B2 | 8/2011 | Trezza et al. |
| 7,989,959 B1 | 8/2011 | Rahman |
| 8,053,903 B2 | 11/2011 | Trezza |
| 8,067,312 B2 | 11/2011 | Trezza |
| 8,084,867 B2 | 12/2011 | Tang et al. |
| 8,093,729 B2 | 1/2012 | Trezza |
| 8,143,712 B2 | 3/2012 | Chen |
| 8,154,131 B2 | 4/2012 | Trezza et al. |
| 8,354,742 B2 | 1/2013 | Camacho et al. |
| 8,482,133 B2 | 7/2013 | Ko et al. |
| 2001/0008310 A1 | 7/2001 | Sakuyama et al. |
| 2001/0035568 A1 | 11/2001 | Shyu |
| 2002/0017718 A1 | 2/2002 | Hikita et al. |
| 2002/0020904 A1 | 2/2002 | Hikita et al. |
| 2002/0056899 A1 | 5/2002 | Hikita et al. |
| 2002/0058357 A1 | 5/2002 | Chang |
| 2002/0105067 A1 | 8/2002 | Oka et al. |
| 2002/0127773 A1 | 9/2002 | Shibata et al. |
| 2002/0130404 A1 | 9/2002 | Ushijima et al. |
| 2002/0190354 A1 | 12/2002 | Park |
| 2002/0190369 A1 | 12/2002 | Hikita et al. |
| 2002/0192866 A1 | 12/2002 | Hikita et al. |
| 2002/0192869 A1 | 12/2002 | Park |
| 2003/0062620 A1 | 4/2003 | Shibata |
| 2003/0082897 A1 | 5/2003 | Sakuyama et al. |
| 2003/0122248 A1 | 7/2003 | Hikita et al. |
| 2003/0146517 A1 | 8/2003 | Lasky et al. |
| 2003/0218191 A1 | 11/2003 | Nordal et al. |
| 2004/0007775 A1 | 1/2004 | Park |
| 2004/0016999 A1 | 1/2004 | Misumi |
| 2004/0026790 A1 | 2/2004 | Hikita et al. |
| 2004/0137708 A1 | 7/2004 | Shibata |
| 2004/0163240 A1 | 8/2004 | Frezza |
| 2004/0245651 A1 | 12/2004 | Nishisako et al. |
| 2004/0259288 A1 | 12/2004 | Mostafazadeh et al. |

(56) References Cited

U.S. PATENT DOCUMENTS

| | | |
|---|---|---|
| 2005/0012116 A1 | 1/2005 | Lim et al. |
| 2005/0040541 A1 | 2/2005 | Kurita et al. |
| 2005/0170558 A1 | 8/2005 | King et al. |
| 2005/0205983 A1 | 9/2005 | Origasa et al. |
| 2005/0242426 A1 | 11/2005 | Kwon et al. |
| 2005/0258530 A1 | 11/2005 | Vindasius et al. |
| 2006/0012038 A1 | 1/2006 | Miyazaki et al. |
| 2006/0105496 A1 | 5/2006 | Chen et al. |
| 2006/0113598 A1 | 6/2006 | Chen et al. |
| 2006/0134832 A1 | 6/2006 | Iwasaki et al. |
| 2006/0211380 A1 | 9/2006 | Mcconnell |
| 2006/0237705 A1 | 10/2006 | Kuo et al. |
| 2006/0237828 A1 | 10/2006 | Robinson et al. |
| 2006/0270104 A1 | 11/2006 | Trovarelli et al. |
| 2006/0278966 A1 | 12/2006 | Trezza et al. |
| 2006/0278980 A1 | 12/2006 | Trezza et al. |
| 2006/0278981 A1 | 12/2006 | Trezza et al. |
| 2006/0278986 A1 | 12/2006 | Trezza |
| 2006/0278988 A1 | 12/2006 | Trezza et al. |
| 2006/0278989 A1 | 12/2006 | Trezza |
| 2006/0278992 A1 | 12/2006 | Trezza et al. |
| 2006/0278993 A1 | 12/2006 | Trezza et al. |
| 2006/0278994 A1 | 12/2006 | Trezza |
| 2006/0278995 A1 | 12/2006 | Trezza |
| 2006/0278996 A1 | 12/2006 | Trezza et al. |
| 2006/0281219 A1 | 12/2006 | Trezza |
| 2006/0281243 A1 | 12/2006 | Trezza |
| 2006/0281292 A1 | 12/2006 | Trezza et al. |
| 2006/0281296 A1 | 12/2006 | Misra et al. |
| 2006/0281303 A1 | 12/2006 | Trezza et al. |
| 2006/0281307 A1 | 12/2006 | Trezza |
| 2006/0281363 A1 | 12/2006 | Trezza |
| 2007/0013038 A1 | 1/2007 | Yang |
| 2007/0018303 A1* | 1/2007 | Lee ................ 257/686 |
| 2007/0037320 A1 | 2/2007 | Mostafazadeh et al. |
| 2007/0120241 A1 | 5/2007 | Trezza et al. |
| 2007/0138562 A1 | 6/2007 | Trezza |
| 2007/0141750 A1 | 6/2007 | Iwasaki et al. |
| 2007/0158839 A1 | 7/2007 | Trezza |
| 2007/0161235 A1 | 7/2007 | Trezza |
| 2007/0167004 A1 | 7/2007 | Trezza |
| 2007/0172987 A1 | 7/2007 | Dugas et al. |
| 2007/0182020 A1 | 8/2007 | Trezza et al. |
| 2007/0196948 A1 | 8/2007 | Trezza |
| 2007/0197013 A1 | 8/2007 | Trezza |
| 2007/0228576 A1 | 10/2007 | Trezza |
| 2008/0001241 A1 | 1/2008 | Tuckerman et al. |
| 2008/0002460 A1 | 1/2008 | Tuckerman et al. |
| 2008/0029879 A1 | 2/2008 | Tuckerman et al. |
| 2008/0083978 A1 | 4/2008 | Hayashi et al. |
| 2008/0128888 A1 | 6/2008 | Park et al. |
| 2008/0171174 A1 | 7/2008 | Trezza |
| 2008/0191363 A1 | 8/2008 | Plants et al. |
| 2008/0224279 A1 | 9/2008 | Caskey et al. |
| 2008/0274590 A1 | 11/2008 | Iwasaki et al. |
| 2008/0303131 A1 | 12/2008 | Mcelrea et al. |
| 2008/0318360 A1 | 12/2008 | Chen et al. |
| 2009/0045527 A1 | 2/2009 | Tsai |
| 2009/0068790 A1 | 3/2009 | Caskey et al. |
| 2009/0137116 A1 | 5/2009 | Trezza |
| 2009/0206458 A1 | 8/2009 | Andrews, Jr. et al. |
| 2009/0209064 A1 | 8/2009 | Nonahasitthichai et al. |
| 2009/0243064 A1* | 10/2009 | Camacho et al. ............. 257/680 |
| 2009/0269888 A1 | 10/2009 | Trezza |
| 2010/0090326 A1* | 4/2010 | Baek et al. .................... 257/686 |
| 2010/0117242 A1 | 5/2010 | Miller et al. |
| 2010/0127768 A1 | 5/2010 | Nonoyama et al. |
| 2010/0140776 A1 | 6/2010 | Trezza |
| 2010/0140811 A1 | 6/2010 | Leal et al. |
| 2010/0197134 A1 | 8/2010 | Trezza |
| 2010/0219503 A1 | 9/2010 | Trezza |
| 2010/0244268 A1 | 9/2010 | Tang et al. |
| 2010/0304565 A1 | 12/2010 | Trezza |
| 2010/0327461 A1 | 12/2010 | Co et al. |
| 2011/0037159 A1 | 2/2011 | Mcelrea et al. |
| 2011/0084365 A1 | 4/2011 | Law et al. |
| 2011/0089522 A1 | 4/2011 | Narazaki |
| 2011/0089554 A1 | 4/2011 | Lee et al. |
| 2011/0090004 A1 | 4/2011 | Schuetz |
| 2011/0109382 A1 | 5/2011 | Jin et al. |
| 2011/0133324 A1 | 6/2011 | Fan et al. |
| 2011/0147931 A1 | 6/2011 | Nondhasitthichai et al. |
| 2011/0147932 A1 | 6/2011 | Trezza et al. |
| 2011/0156232 A1 | 6/2011 | Youn et al. |
| 2011/0161583 A1 | 6/2011 | Youn |
| 2011/0198752 A1 | 8/2011 | Nondhasitthichai et al. |
| 2011/0212573 A1 | 9/2011 | Trezza et al. |
| 2011/0223717 A1 | 9/2011 | Trezza et al. |
| 2011/0250722 A1 | 10/2011 | Trezza |
| 2011/0263119 A1 | 10/2011 | Li et al. |
| 2011/0272788 A1 | 11/2011 | Kim et al. |
| 2011/0275178 A1 | 11/2011 | Trezza et al. |
| 2011/0291229 A1 | 12/2011 | Byeon et al. |
| 2011/0291289 A1 | 12/2011 | Yoon et al. |
| 2012/0013018 A1 | 1/2012 | Chen |
| 2012/0034739 A1 | 2/2012 | Trezza |
| 2012/0043664 A1 | 2/2012 | Coteus et al. |
| 2012/0049361 A1 | 3/2012 | Park et al. |
| 2012/0049365 A1 | 3/2012 | Ko et al. |
| 2012/0051113 A1 | 3/2012 | Choi et al. |
| 2012/0068360 A1 | 3/2012 | Best |
| 2012/0069530 A1 | 3/2012 | Inoue et al. |
| 2012/0086125 A1 | 4/2012 | Kang et al. |
| 2012/0108009 A1 | 5/2012 | Trezza |
| 2012/0168960 A1 | 7/2012 | Kim et al. |
| 2014/0151877 A1* | 6/2014 | Lim et al. ..................... 257/737 |
| 2014/0199811 A1* | 7/2014 | Haba et al. ................... 438/107 |

FOREIGN PATENT DOCUMENTS

| | | |
|---|---|---|
| JP | H10144862 A | 5/1998 |
| JP | H10209370 A | 8/1998 |
| JP | H10256472 A | 9/1998 |
| JP | H10270636 A | 10/1998 |
| JP | H11040601 | 2/1999 |
| JP | H11163051 | 6/1999 |
| JP | H11163256 A | 6/1999 |
| JP | 2000216328 A | 8/2000 |
| JP | 2000223655 A | 8/2000 |
| JP | 2000227457 A | 8/2000 |
| JP | 2000228484 A | 8/2000 |
| JP | 2000228485 A | 8/2000 |
| JP | 2000228487 A | 8/2000 |
| JP | 2000230964 A | 8/2000 |
| JP | 2000232200 A | 8/2000 |
| JP | 2000243896 A | 9/2000 |
| JP | 2000243902 A | 9/2000 |
| JP | 2000243903 A | 9/2000 |
| JP | 2000243904 A | 9/2000 |
| JP | 2000252409 A | 9/2000 |
| JP | 2000260961 A | 9/2000 |
| JP | 2001015680 A | 1/2001 |
| JP | 2001085609 A | 3/2001 |
| JP | 2001094037 A | 4/2001 |
| JP | 2001094038 A | 4/2001 |
| JP | 2001094042 A | 4/2001 |
| JP | 2001110983 A | 4/2001 |
| JP | 2001156249 A | 6/2001 |
| JP | 2001168270 A | 6/2001 |
| JP | 2001196528 A | 7/2001 |
| JP | 2001267358 A | 9/2001 |
| JP | 2001320012 A | 11/2001 |
| JP | 2002026238 A | 1/2002 |
| JP | 2002110851 A | 4/2002 |
| JP | 2002110894 A | 4/2002 |
| JP | 3286196 B2 | 5/2002 |
| JP | 2003060155 A | 2/2003 |
| JP | 2003060156 A | 2/2003 |
| JP | 2003110084 A | 4/2003 |
| JP | 2003110085 A | 4/2003 |
| JP | 2003142647 A | 5/2003 |
| JP | 2003142649 A | 5/2003 |
| JP | 3423930 B2 | 7/2003 |
| JP | 2003249515 A | 9/2003 |

(56) References Cited

FOREIGN PATENT DOCUMENTS

| | | | |
|---|---|---|---|
| JP | 2003282820 A | 10/2003 |
| JP | 2004006941 A | 1/2004 |
| JP | 2004071648 A | 3/2004 |
| JP | 2004079685 A | 3/2004 |
| JP | 3543253 B2 | 7/2004 |
| JP | 3543254 B2 | 7/2004 |
| JP | 3615672 B2 | 2/2005 |
| JP | 2005064362 A | 3/2005 |
| JP | 2005184023 A | 7/2005 |
| JP | 2006024752 A | 1/2006 |
| JP | 2006179570 A | 7/2006 |
| JP | 2007059547 A | 3/2007 |
| JP | 2007059548 A | 3/2007 |
| JP | 2007165631 A | 6/2007 |
| JP | 2007165671 A | 6/2007 |
| JP | 2008219039 A | 9/2008 |
| JP | 2009021329 A | 1/2009 |
| KR | 19990037241 | 5/1999 |
| KR | 100206893 B1 | 7/1999 |
| KR | 20010067308 A | 7/2001 |
| KR | 20020008586 A | 1/2002 |
| KR | 100363057 | 11/2002 |
| KR | 20030012192 A | 2/2003 |
| KR | 100378285 B1 | 3/2003 |
| KR | 100393101 | 7/2003 |
| KR | 100434201 B1 | 6/2004 |
| KR | 100467946 | 1/2005 |
| KR | 100488256 B1 | 5/2005 |
| KR | 100522223 B1 | 12/2005 |
| KR | 20060036126 A | 4/2006 |
| KR | 100604848 B1 | 7/2006 |
| KR | 100631934 B1 | 10/2006 |
| KR | 20080016124 A | 2/2008 |
| KR | 20080018895 A | 2/2008 |
| KR | 20080018896 A | 2/2008 |
| KR | 100817078 B1 | 3/2008 |
| KR | 20090091453 A | 8/2009 |
| KR | 20100011613 A | 2/2010 |
| KR | 20110012645 A | 2/2011 |
| KR | 20110042393 A | 4/2011 |
| KR | 20110052133 A | 5/2011 |
| KR | 20110078188 A | 7/2011 |
| KR | 20110078189 A | 7/2011 |
| KR | 101070167 | 10/2011 |
| KR | 101088546 B1 | 12/2011 |
| KR | 101090616 | 12/2011 |
| KR | 20110130113 A | 12/2011 |
| KR | 20110131578 A | 12/2011 |
| KR | 20110131683 A | 12/2011 |
| KR | 20110137059 A | 12/2011 |
| KR | 20120019882 A | 3/2012 |
| KR | 101137688 B1 | 4/2012 |
| KR | 20120035725 A | 4/2012 |
| KR | 101137934 B1 | 5/2012 |
| KR | 101168786 B1 | 7/2012 |
| KR | 101191523 B1 | 10/2012 |
| KR | 101224299 | 1/2013 |

* cited by examiner

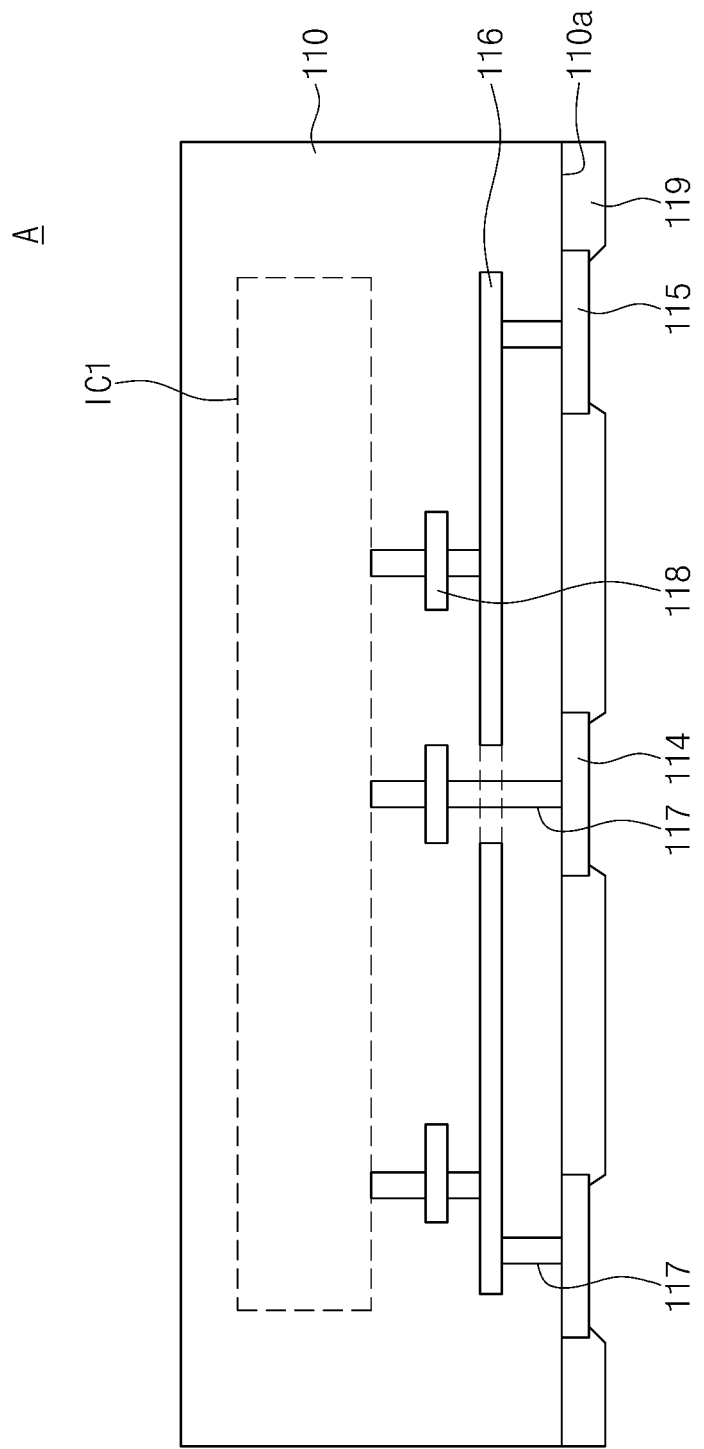

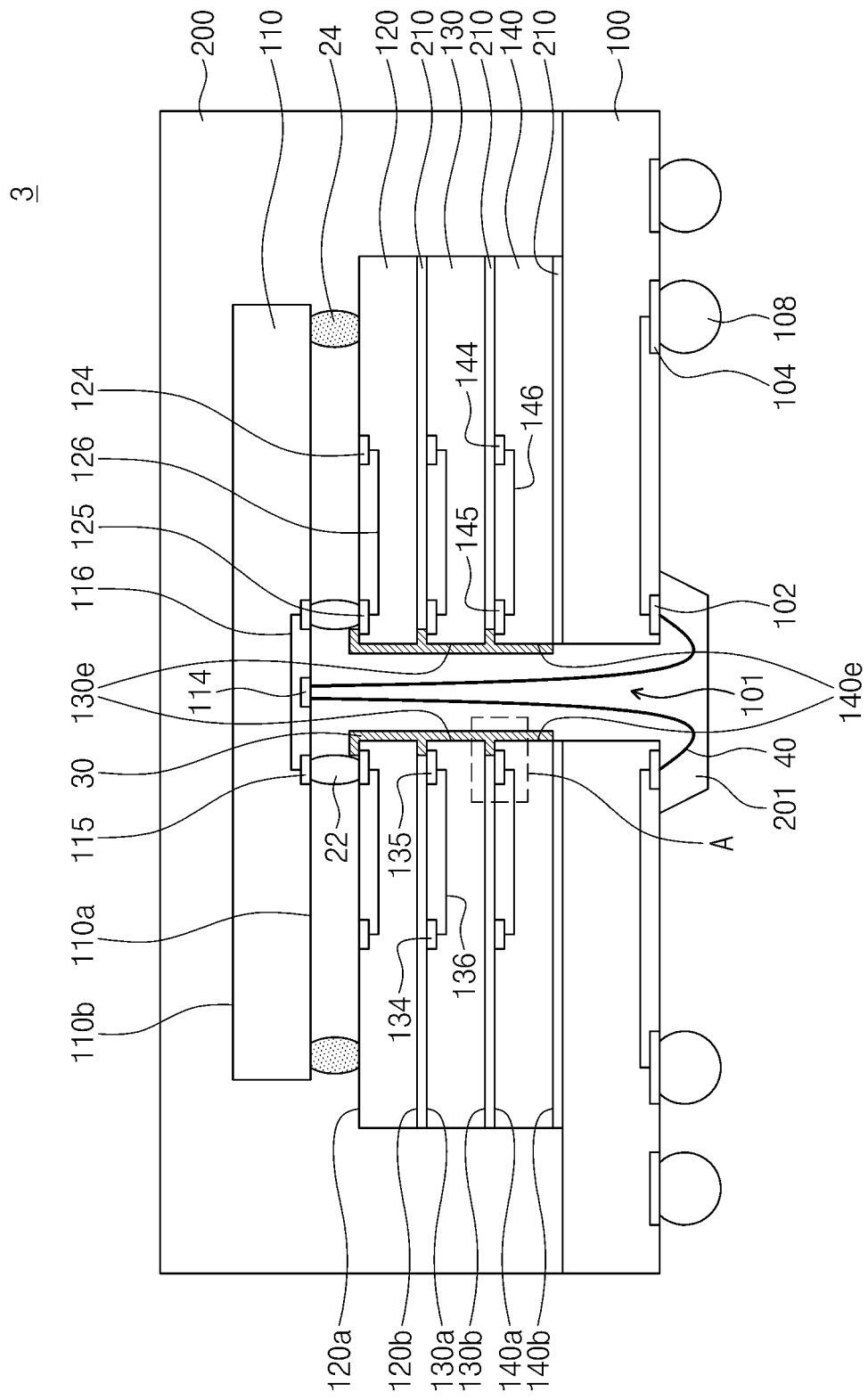

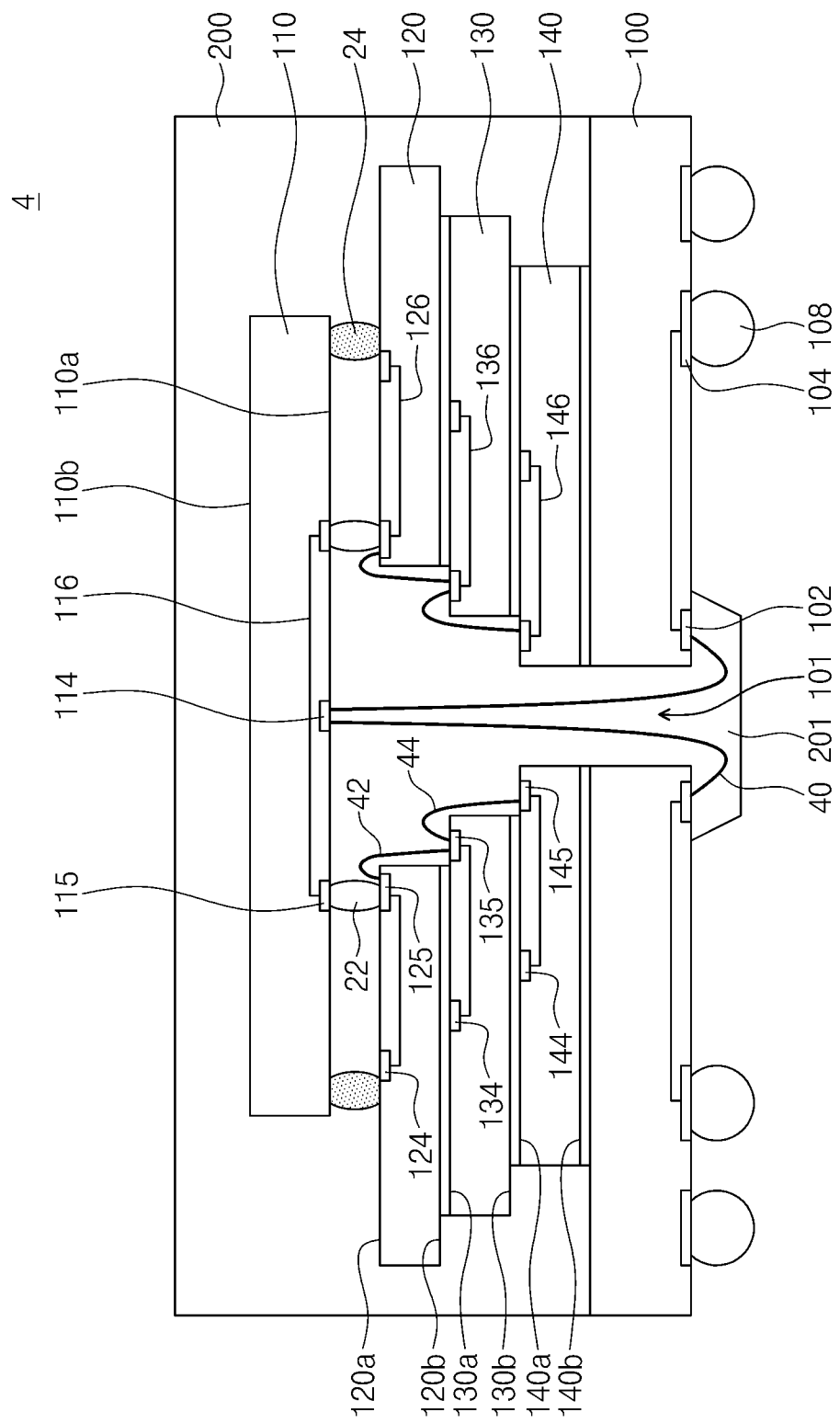

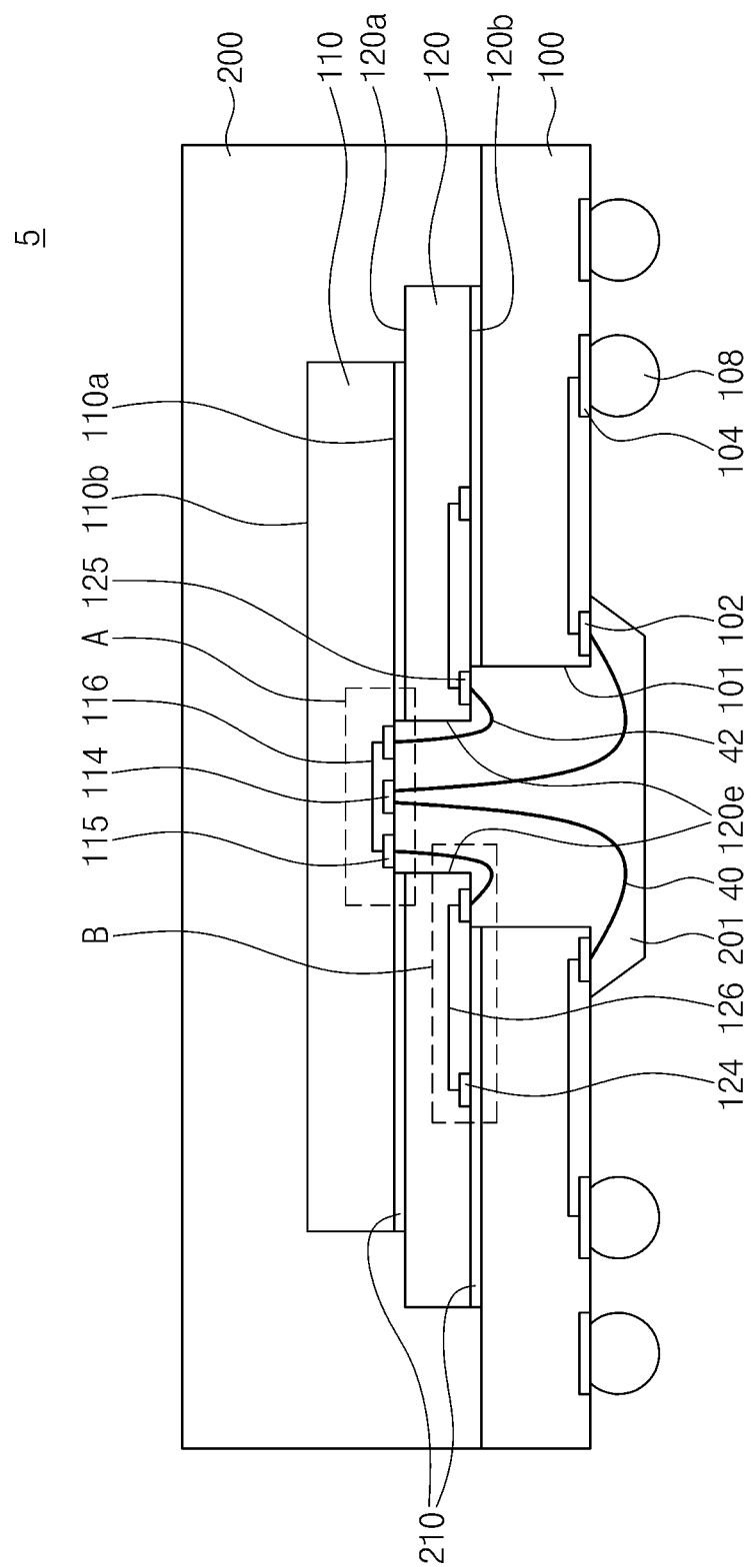

SEMICONDUCTOR PACKAGE

CROSS-REFERENCE TO RELATED APPLICATIONS

This U.S. non-provisional patent application claims priority under 35 U.S.C. §119 to Korean Patent Application No. 10-2012-0149602, filed on Dec. 20, 2012, in the Korean Intellectual Property Office, the entire contents of which are hereby incorporated by reference.

BACKGROUND OF THE INVENTION

Example embodiments of the inventive concepts relate to a semiconductor device, and in particular, to a semiconductor package.

There is a growing trend to fabricate lightweight, small-sized, high speed, multifunctional, high performance, and low-cost electronic systems. In response to such a trend, multi-chip stacked package techniques and/or system in package techniques have been proposed. In a multi-chip stacked package or a system in package, one or more functions of a plurality of semiconductor devices may be performed in a single semiconductor package. The multi-chip stacked package or the system in package may have a thickness larger than that of a single chip package, but may have a similar size to the single chip package in terms of a planar surface area or "footprint". Thus, the multi-chip stacked package or the system in package may be used in smaller (e.g., mobile) devices with high performance requirements such as, for example, mobile phones, notebook computers, memory cards, portable camcorders, and the like.

SUMMARY

Example embodiments of the inventive concepts provide a semiconductor package with improved electric characteristics.

Other example embodiments of the inventive concepts provide a semiconductor package that can be fabricated with low cost.

According to example embodiments of the inventive concepts, a semiconductor package may include a package substrate including an opening provided at a central region thereof and a circuit pattern provided adjacent to the opening, a first semiconductor chip provided on the package substrate to include a first integrated circuit, a first center pad, which may be disposed at a central region thereof exposed by the opening and may be electrically connected to the circuit pattern by a first wire, and first bonding pads, each of which may be disposed at the central region thereof to be spaced apart from the first center pad and be electrically connected to the first integrated circuit, a pair of second semiconductor chips mounted between the package substrate and the first semiconductor chip and spaced apart from each other to include a second integrated circuit and second bonding pads, the second bonding pads being provided adjacent to opposite edge portions thereof to correspond to the first bonding pads and be electrically connected to the second integrated circuit, and a connection element electrically connecting the first bonding pads with the second bonding pads. The first semiconductor chip may have a memory capacity that may be two times that of each of the second semiconductor chips, and a total memory capacity of the package may be $2^n$ times a memory capacity of the first semiconductor chip.

In example embodiments, the first center pad may be electrically connected to the first bonding pads via the first integrated circuit.

In example embodiments, the first semiconductor chip may have a first surface facing the package substrate and a second surface opposite the first surface, and the first center pad and the first bonding pads may be disposed on the first surface, and each of the second semiconductor chips may have a third surface facing the first surface of the first semiconductor chip and a fourth surface opposite the third surface, and the second bonding pads may be disposed on the third surface.

In example embodiments, the second semiconductor chips may further include second center pads disposed at central regions thereof and connected to the second integrated circuit, and the second center pads may be electrically connected to the second bonding pads via a second redistributed layer.

In example embodiments, the second integrated circuit may be electrically connected to the second bonding pads, without the second center pads provide at the central region of thereof.

In example embodiments, the semiconductor package may further include a pair of third semiconductor chips provided between the package substrate and the second semiconductor chips and spaced apart from each other to include a third integrated circuit and third bonding pads, the third bonding pads being provided at opposite edge portions thereof and being electrically connected to the third integrated circuit, and a pair of fourth semiconductor chips provided between the package substrate and the third semiconductor chips and spaced apart from each other to include a fourth integrated circuit and fourth bonding pads, the fourth bonding pads being provided at opposite edge portions thereof and being electrically connected to the fourth integrated circuit. The second bonding pads, the third bonding pads, and the fourth bonding pads may be connected to each other in a side connection manner or a wire connection manner.

In example embodiments, each of the third semiconductor chips may have a fifth surface facing the second semiconductor chips and a sixth surface opposite the fifth surface, and the third bonding pads may be disposed on the fifth surface, and each of the fourth semiconductor chips may have a seventh surface facing the sixth surface of the third semiconductor chip and an eighth surface opposite the seventh surface, and the fourth bonding pads may be disposed on the seventh surface.

In example embodiments, the connection element may include first bumpers disposed between the first semiconductor chip and the second semiconductor chips.

In example embodiments, the first semiconductor chip may have a first surface facing the package substrate and a second surface opposite the first surface, and the first center pad and the first bonding pads may be disposed on the first surface, each of the second semiconductor chips may have a third surface facing the first surface of the first semiconductor chip and a fourth surface opposite the third surface, and the second bonding pads may be disposed on the fourth surface.

In example embodiments, the connection element may include a second wire, the second semiconductor chips may be shifted toward the opening of the package substrate to expose the second bonding pad of the second semiconductor chips, and the second semiconductor chips expose the first bonding pads.

In example embodiments, the semiconductor package may further include a pair of third semiconductor chips provided between the package substrate and the second semiconductor chips and spaced apart from each other to include a third integrated circuit and third bonding pads, the third bonding pads being provided at opposite edge portions thereof and being electrically connected to the third integrated circuit, and a pair of fourth semiconductor chips provided between the package substrate and the third semiconductor chips and spaced apart from each other to include a fourth integrated circuit and fourth bonding pads, the fourth bonding pads being provided at opposite edge portions thereof and being electrically connected to the fourth integrated circuit.

In example embodiments, each of the third semiconductor chips may have a fifth surface facing the second semiconductor chips and a sixth surface opposite the fifth surface, and the third bonding pads and the third integrated circuit may be disposed on the sixth surface, and each of the fourth semiconductor chips may have a seventh surface facing the sixth surface of the third semiconductor chip and an eighth surface opposite the seventh surface, and the fourth bonding pads and the fourth integrated circuit may be disposed on the eighth surface.

In example embodiments, the third semiconductor chips may be shifted toward the opening of the package substrate to expose the third bonding pad of the third semiconductor chips, the fourth semiconductor chips may be shifted toward the opening of the package substrate to expose the fourth bonding pad of the fourth semiconductor chips, the second and third bonding pads may be connected to each other by a third wire, and the third and fourth bonding pads may be connected to each other by a fourth wire.

According to example embodiments of the inventive concepts, a semiconductor package may include a package substrate with a circuit pattern, a first semiconductor chip provided on the package substrate to include a first integrated circuit and a through-silicon via, the first semiconductor chip including a first surface facing the package substrate and a second surface opposite the first surface, the through-silicon via being provided at a central region thereof and electrically connected to the circuit pattern, and a pair of second semiconductor chips disposed on the first semiconductor chip to be spaced apart from each other and include a second integrated circuit, each of the second semiconductor chips having a third surface facing the first semiconductor chip and a fourth surface opposite the third surface.

In example embodiments, the second semiconductor chips have a memory capacity that may be two times that of the first semiconductor chip, and a total memory capacity of the package may be $2^n$ times a memory capacity of the first semiconductor chip.

In example embodiments, the semiconductor package may further include a first bumper provided between the first semiconductor chip and the package substrate to connect the through-silicon via electrically to the circuit pattern.

In example embodiments, the first semiconductor chip may further include first bonding pads disposed on the second surface and connected to the through-silicon via, and the second semiconductor chips may further include second bonding pads disposed on the fourth surface and electrically connected to the second integrated circuit.

In example embodiments, the semiconductor package may further include a pair of third semiconductor chips provided on the second semiconductor chips and spaced apart from each other to include a third integrated circuit and third bonding pads, the third bonding pads being provided at opposite edge portions thereof and being electrically connected to the third integrated circuit, and a pair of fourth semiconductor chips provided on the third semiconductor chips and spaced apart from each other to include a fourth integrated circuit and fourth bonding pads, the fourth bonding pads being provided at opposite edge portions thereof and being electrically connected to the fourth integrated circuit.

In example embodiments, each of the third semiconductor chips may have a fifth surface facing the second semiconductor chips and a sixth surface opposite the fifth surface, and the third bonding pads may be disposed on the sixth surface, and each of the fourth semiconductor chips may have a seventh surface facing the sixth surface of the third semiconductor chip and an eighth surface opposite the seventh surface, and the fourth bonding pads may be disposed on the eighth surface.

In example embodiments, the second semiconductor chips further include connection pads on the third surface, and the semiconductor package may further include second bumpers provided between the first and second semiconductor chips to connect the connection pads electrically to the first bonding pad.

In example embodiments, the connection pad, the second bonding pads, the third bonding pads, and the fourth bonding pads may be connected to each other in a side connection manner.

In example embodiments, the third semiconductor chips may be shifted toward an edge of the package substrate to expose the second bonding pads of the second semiconductor chips, and the fourth semiconductor chips may be shifted toward the edge of the package substrate to expose the third bonding pads of the third semiconductor chips.

In example embodiments, the second semiconductor chips further include connection pads on the third surface, the semiconductor package may further include second bumpers that may be provided between the first semiconductor chip and the second semiconductor chips to connect the connection pads to the first bonding pad, and the connection pads, the second bonding pads, the third bonding pads, and the fourth bonding pads may be connected to each other in a side connection manner.

In example embodiments, the first bonding pad, the second bonding pads, the third bonding pads, and the fourth bonding pads may be connected to each other in a wire bonding manner.

In example embodiments, the first bonding pad may be provided on the first surface.

In example embodiments, the first semiconductor chip may further include first bonding pads provided on the first surface and connected to the through-silicon via, and the second semiconductor chips further include second bonding pads provided on the third surface and electrically connected to the second integrated circuit.

In example embodiments, the semiconductor package may further include a pair of third semiconductor chips provided on the second semiconductor chips and spaced apart from each other to include a third integrated circuit and third bonding pads, the third bonding pads being provided at opposite edge portions thereof and being electrically connected to the third integrated circuit, and a pair of fourth semiconductor chips provided on the third semiconductor chips and spaced apart from each other to include a fourth integrated circuit and fourth bonding pads, the fourth bonding pads being provided at opposite edge portions thereof and being electrically connected to the fourth integrated circuit.

In example embodiments, each of the third semiconductor chips may have a fifth surface facing the second semiconductor chips and a sixth surface opposite the fifth surface, and the third bonding pads may be disposed on the fifth surface, and each of the fourth semiconductor chips may have a seventh surface facing the sixth surface of the third semiconductor chip and an eighth surface opposite the seventh surface, and the fourth bonding pads may be disposed on the seventh surface.

In example embodiments, the second bonding pads, the third bonding pads, and the fourth bonding pads may be connected to each other in a side connection manner.

In example embodiments, the third semiconductor chips may be shifted toward the central region of the package substrate to expose the third bonding pads, and the fourth semiconductor chips may be shifted toward the central region of the package substrate to expose the fourth bonding pads.

In example embodiments, the second bonding pads, the third bonding pads, and the fourth bonding pads may be connected to each other in a wire bonding manner.

In example embodiments, the semiconductor package may further include a second bumper disposed between the first and second semiconductor chips to connect the second bonding pads to the through-silicon via.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 2B and 2C are enlarged views illustrating portions A and B of FIG. 2A, respectively.

FIG. 4A is a sectional view of a semiconductor package according to a third embodiment of the inventive concepts.

FIG. 5 is a sectional view of a semiconductor package according to a fourth embodiment of the inventive concepts.

FIG. 6A is a sectional view of a semiconductor package according to a fifth embodiment of the inventive concepts.

Figure 1:
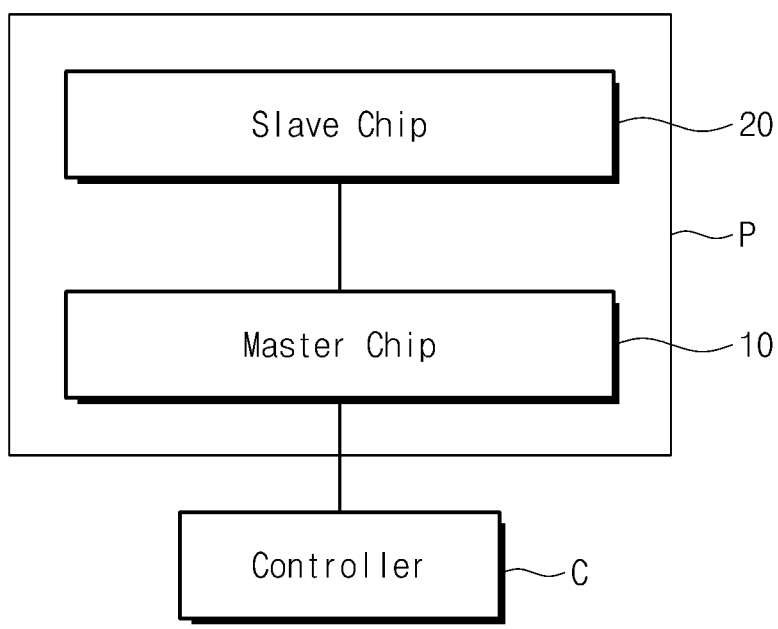
FIG. 1 is a schematic diagram illustrating a semiconductor package according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein. Rather, these embodiments are provided so that this disclosure will be thorough and complete, and will fully convey the concepts of example embodiments to those of ordinary skill in the art. In the drawings, the thicknesses of layers and regions may be exaggerated for clarity. Like reference numerals in the drawings denote like elements, and thus redundant descriptions may be omitted.

It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present. Other words used to describe the relationship between elements or layers should be interpreted using the same principles discussed above (e.g., "between" versus "directly between," "adjacent" versus "directly adjacent," "on" versus "directly on"). As used herein the term "and/or" includes any and all combinations of one or more of the associated listed items.

It will be understood that, although the terms "first," "second," etc. may be used herein to describe various elements, components, regions, layers and/or sections, these elements, components, regions, layers and/or sections should not be limited by these terms. Instead, these terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to limit the inventive concepts. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing variances. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concepts.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic diagram illustrating a semiconductor package P, according to example embodiments of the inventive concepts, and an external controller C. The semiconductor package P may include a master chip 10 and at least one slave chip 20. The master chip 10 may be configured to receive control signals (e.g., address and command), voltage signals, and data from an external controller C, send them to the slave chip 20, and control the one or more slave chips 20.

Figure 2A:
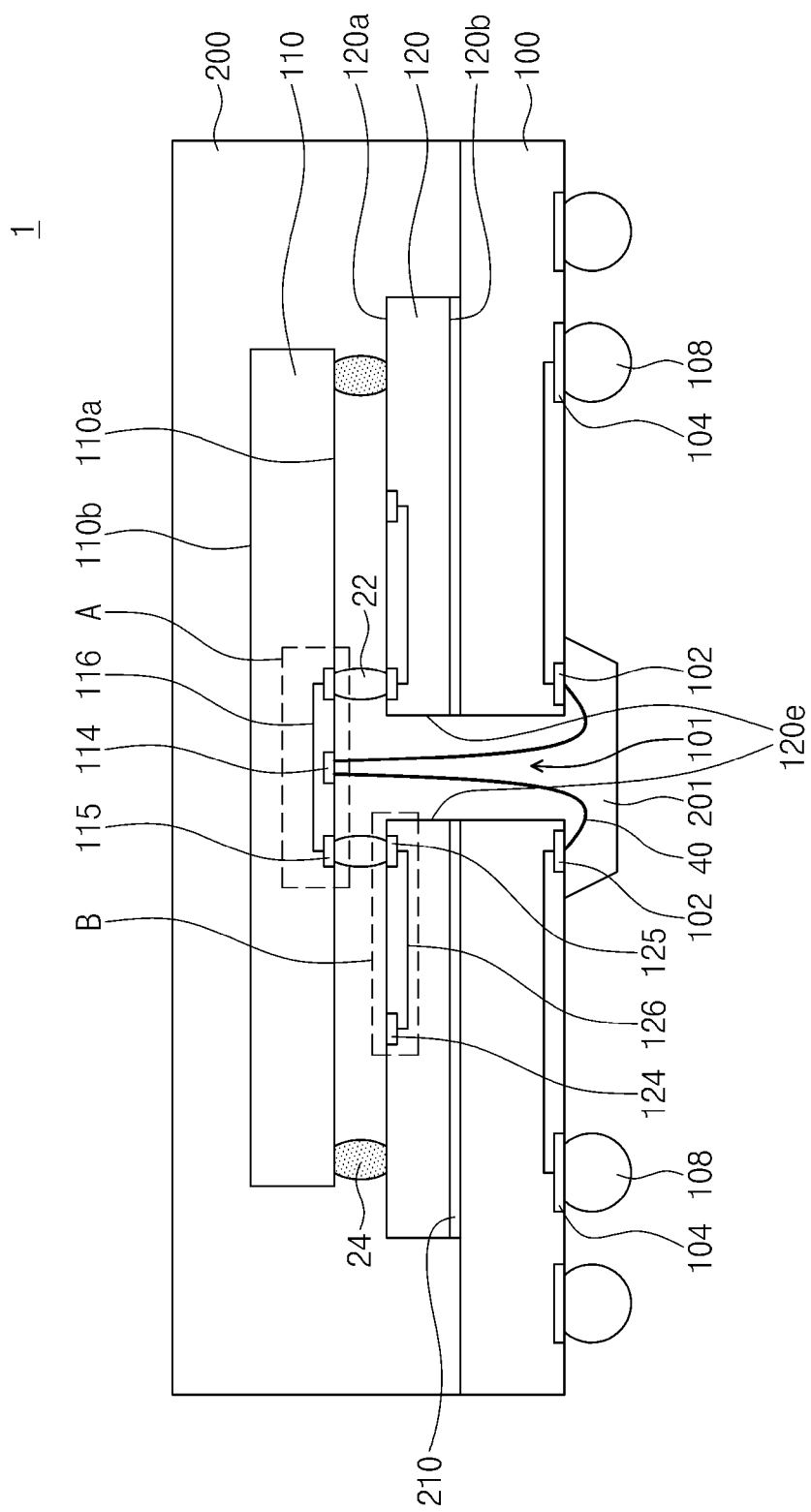
FIG. 2A is a sectional view of a semiconductor package according to a first embodiment of the inventive concepts.
Figure 2C:
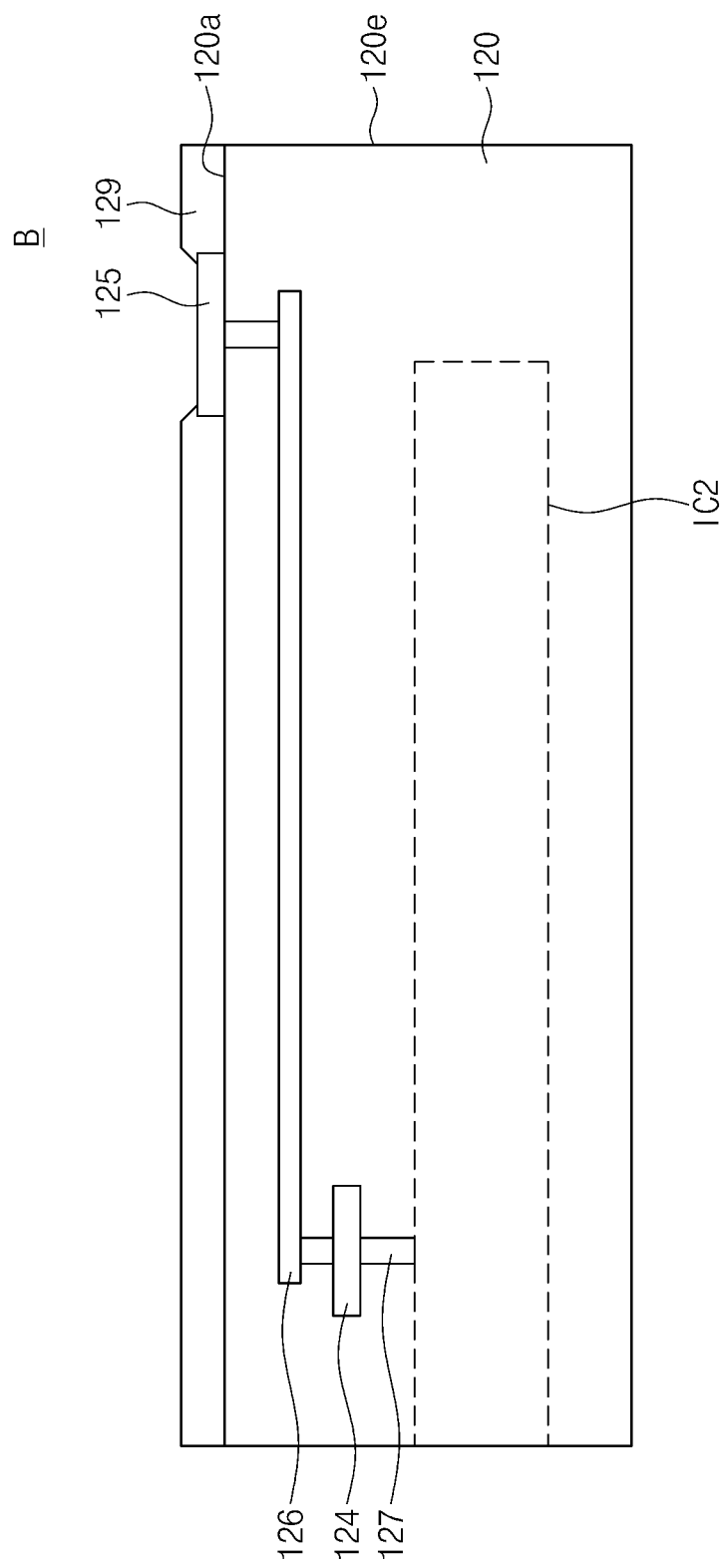
Figure 2D:
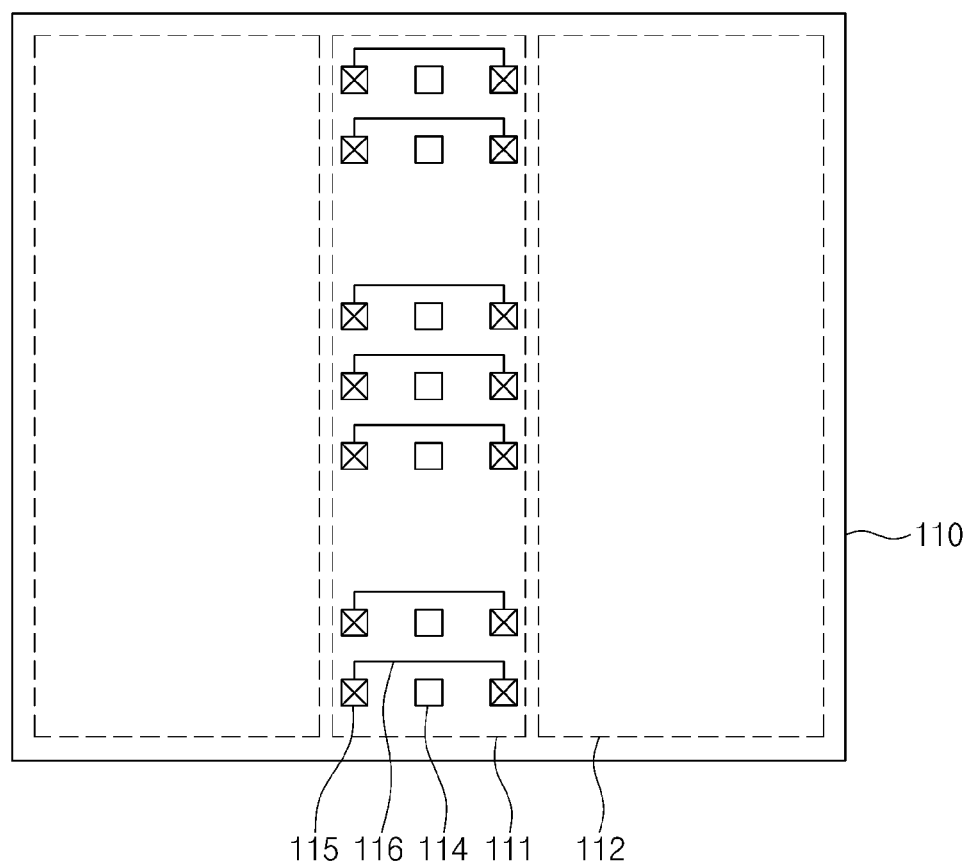
FIG. 2D is a schematic plan view illustrating a bottom surface of a first semiconductor chip.
Figure 2E:
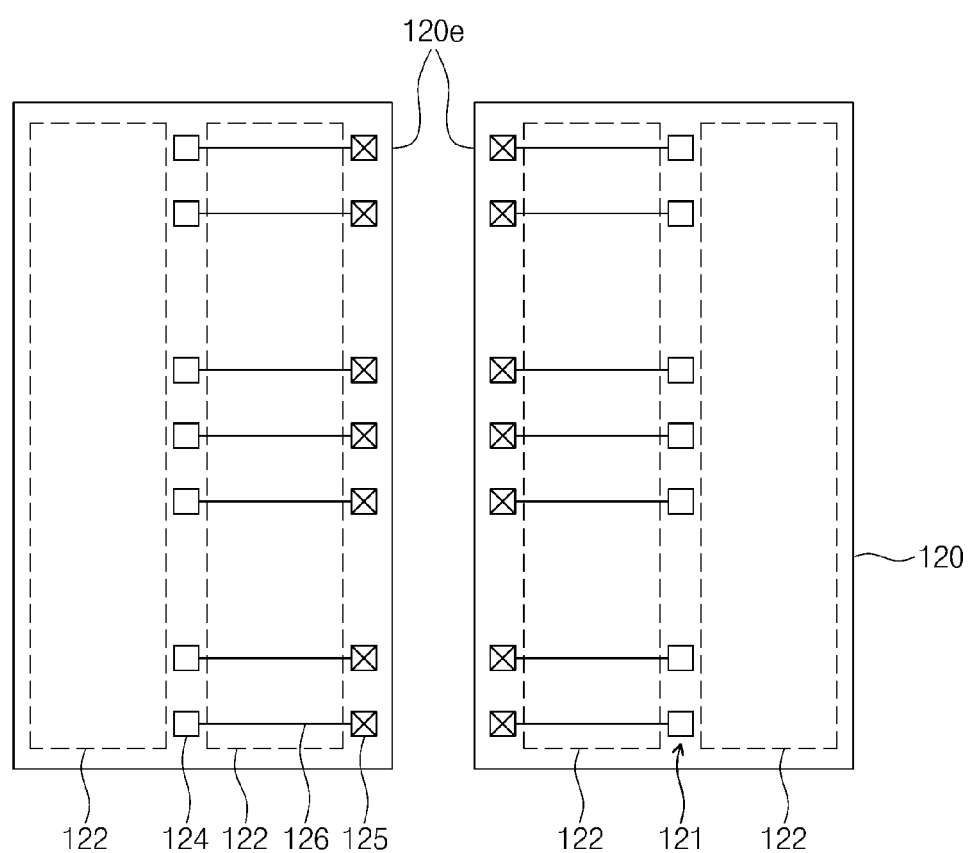
FIG. 2E is a schematic plan view illustrating top surfaces of second semiconductor chips.

A semiconductor package 1, according to a first embodiment of the inventive concepts, will be described with reference to FIGS. 2A through 2E. FIG. 2A is a schematic cross-sectional view of the semiconductor package 1 according to a first embodiment of the inventive concepts. FIGS. 2B and 2C are enlarged views of portions A and B, respectively, of the semiconductor package 1 of FIG. 2A. FIG. 2D is a schematic plan view illustrating a bottom surface of a first semiconductor chip 110, and FIG. 2E is a schematic plan view illustrating top surfaces of second semiconductor chips 120.

Referring to FIGS. 2A through 2E, the semiconductor package 1 may include a package substrate 100, a first semiconductor chip 110 on the package substrate 100, and a pair of second semiconductor chips 120 spaced apart from each other and mounted between the package substrate 100 and the first semiconductor chip 110.

The package substrate 100 may be a printed circuit board. In example embodiments, an opening 101 may be formed through a center of the package substrate 100. The package substrate 100 may include circuit patterns 102 provided on opposite sides of and adjacent to the opening 101. The circuit patterns 102 may be provided on a bottom surface of the package substrate 100 and be electrically connected to a respective external pad 104. To connect the semiconductor package 1 electrically to an external device, at least one external terminal 108 (e.g., a solder bump or a solder ball) may be provided on the external pad 104.

The first semiconductor chip 110 may have a first surface 110a and a second surface 110b opposite the first surface. In example embodiments, the first semiconductor chip 110 may be provided in such a way that the first surface 110a faces the package substrate 100. The first semiconductor chip 110 may include a pair of cell regions 112 and a central region 111 interposed between the cell regions 112. The first semiconductor chip 110 may include a first integrated circuit IC1, a first center pad 114, and first bonding pads 115.

As shown in FIGS. 2B and 2D, the first integrated circuit IC1 may be formed in the first semiconductor chip 110 adjacent to the first surface 110a. The first center pad 114 and the first bonding pads 115 may be disposed on the first surface 110a of the central region 111. The first center pad 114 may be exposed by the opening 101. The first bonding pads 115 may be provided spaced apart from the first center pad 114. The first bonding pads 115 may be electrically connected to the first integrated circuit IC1 via a first contact 117 and a first internal pad 118.

In example embodiments, the first bonding pads 115 may include a pair of first bonding pads 115 provided on opposite sides of each first center pad 114. The pair of the first bonding pads 115 may be connected to each other via a first redistributed line 116. The first center pad 114 may be separated from the first bonding pads 115 and the first redistributed line 116. The first center pad 114 and the first bonding pads 115 may be electrically connected to each other through the first integrated circuit IC1. A first lower insulating layer 119 may be provided on the first surface 110a of the first semiconductor chip 110 to cover the first surface 110a while exposing the first center pad 114 and the first bonding pads 115.

Referring back to FIG. 2A, the second semiconductor chips 120 may be attached to the package substrate 100 by an adhesive layer 210. The adhesive layer 210 may be an insulating film or tape, which may be formed of epoxy or silicone. The second semiconductor chips 120 may include edge portions 120e that are disposed on opposite sides of and adjacent to the opening 101 of the package substrate 100 to face each other. The second semiconductor chips 120 may have a third surface 120a facing the first surface 110a of the first semiconductor chip 110 and a fourth surface 120b opposite the third surface 120a.

As shown in FIGS. 2C and 2E, the second semiconductor chip 120 may include a second integrated circuit IC2, second center pads 124, and second bonding pads 125. The second integrated circuit IC2 may be formed in the second semiconductor chip 120 adjacent to the third surface 120a. The second center pads 124 and the second bonding pads 125 may be disposed on the third surface 120a of the second semiconductor chip 120. The second center pads 124 may be provided in a central region 121 of the second semiconductor chip 120. A pair of cell regions 122 may be provided on opposite sides of the second center pads 124. The second bonding pads 125 may be provided adjacent to edge portions 120e of the second semiconductor chips 120 that face each other across the opening 101. The second bonding pads 125 may be provided to correspond to the first bonding pads 115 and be electrically connected to the second center pads 124 via a second redistributed line 126. The second bonding pads 125 may be electrically connected to the second integrated circuit IC2 via the second center pads 124. A second insulating layer 129 may be provided on the third surface 120a of the second semiconductor chip 120 to cover the third surface 120a and expose the second bonding pads 125.

Referring back to FIG. 2A, the semiconductor package 1 may further include first bumpers 22 electrically connecting the first bonding pads 115 with the second bonding pads 125, and dummy bumpers 24 provided spaced apart from the first bumpers 22 to support the first and second semiconductor chips 110 and 120. The first bumpers 22 may be arranged below the first semiconductor chip 110 and adjacent opposite sides of the opening 101, while the dummy bumpers 24 may be provided below the first semiconductor chip 110 and away from the opening 101.

At least one main bonding wire 40 may be provided in the opening 101 to electrically connect the first center pad 114 of the first semiconductor chip 110 with the circuit pattern 102 of the package substrate 100.

A molding layer 200 may be formed to cover the first and second semiconductor chips 110 and 120. The molding layer 200 may include a protruding portion 201, which protrudes from the opening 101 away from a bottom of the package substrate 100.

At least one of the first and second semiconductor chips 110 and 120 may be a memory chip, such as DRAM or FLASH memory. The first semiconductor chip 110 may be a master chip, and the first integrated circuit IC1 may include memory cells for storing data and a control circuit and/or a power circuit for controlling operations of the memory cells. One or more of the second semiconductor chips 120 may be a slave chip, and the second integrated circuit IC2 may include memory cells for storing data. The second semiconductor chips 120 may be configured without a control circuit and/or a power circuit.

The first semiconductor chip 110 may be configured to communicate with an external controller C (see FIG. 1) through the main bonding wire 40 and to control the second semiconductor chips 120 through the first bumpers 22. Control signals (e.g., address and command signals), voltage signals, and data to be transmitted from the controller C may be provided to the first semiconductor chip 110 through the main bonding wire 40, and data to be read out from the memory cells of the first or second semiconductor chips 110 or 120 may also be transmitted to the controller C through the main bonding wire 40.

Since the second semiconductor chips 120 communicate with the external controller C through the main bonding wire 40 and the first semiconductor chip 110, it is possible to reduce a parasitic capacitance in the communication. Further, since a bonding wire, rather than a through-silicon via, is used to connect the first and second semiconductor chips 110 and 120 to the outside, it is possible to reduce fabrication costs of the semiconductor package.

In the case where the first and second semiconductor chips 110 and 120 are memory chips, a memory capacity of the first semiconductor chip 110 may, for example, be twice that of each of the second semiconductor chips 120. A total memory capacity of the semiconductor package 1 may be $2^n$ times that of the first semiconductor chip 110, where n is an integer.

Figure 3A:
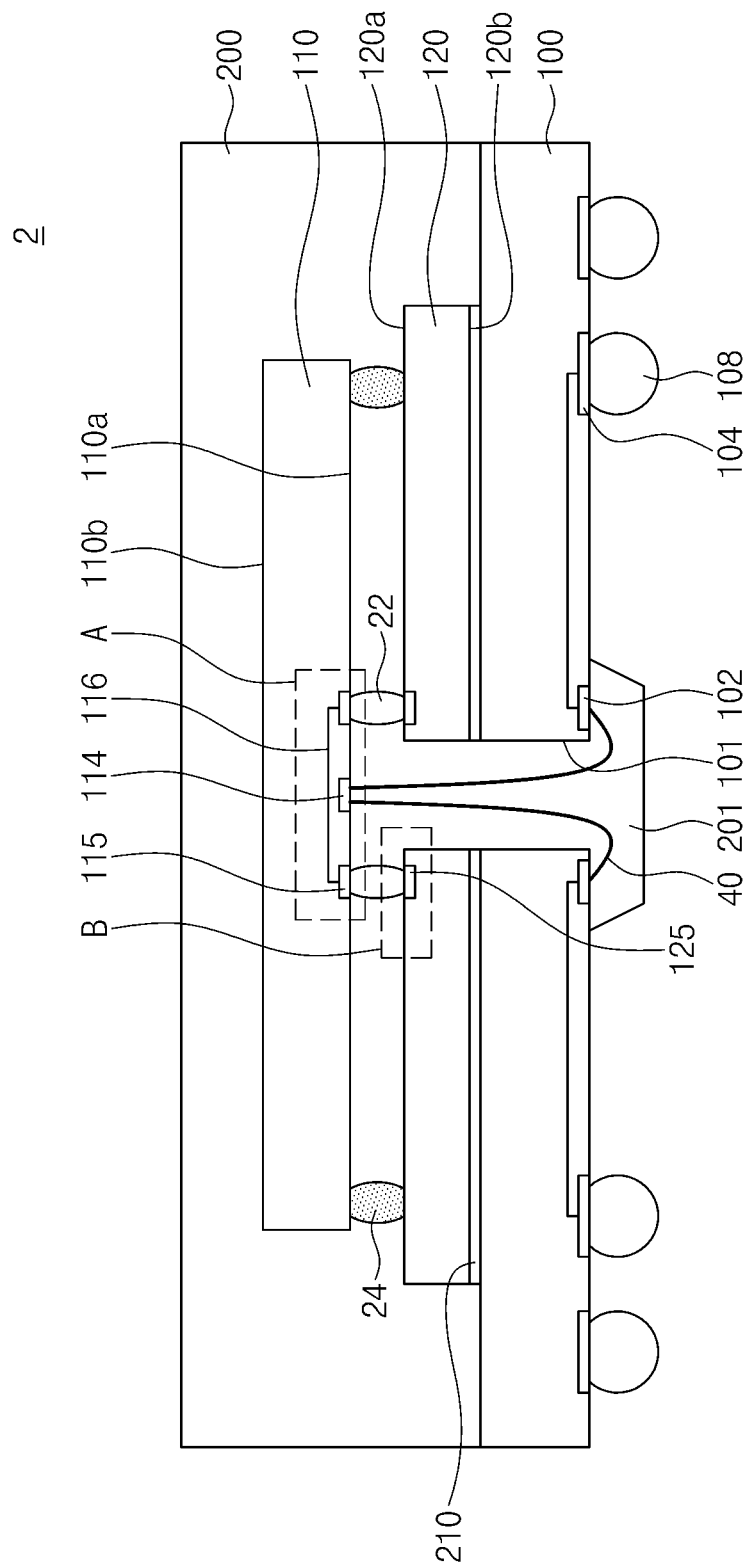
FIG. 3A is a sectional view of a semiconductor package according to a second embodiment of the inventive concepts.
Figure 3B:
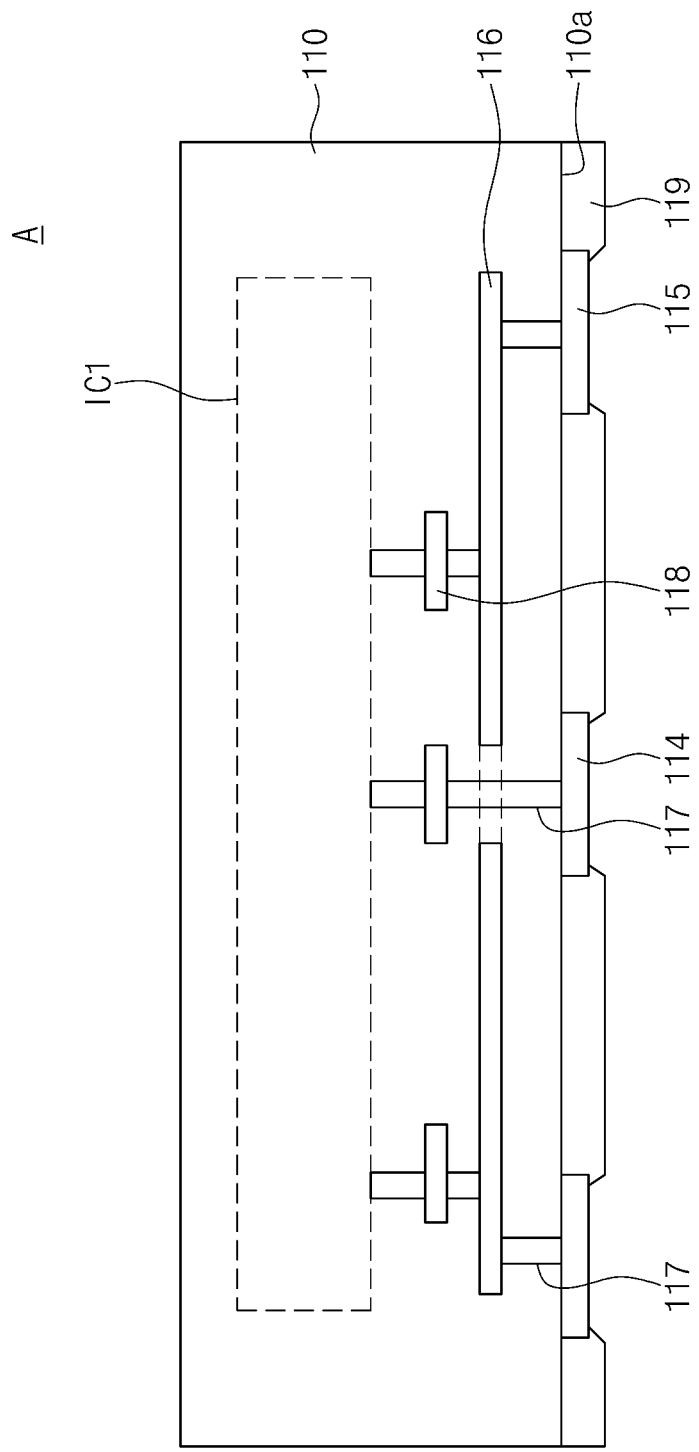
FIGS. 3B and 3C are enlarged views illustrating portions A and B of FIG. 3A, respectively.
Figure 3C:
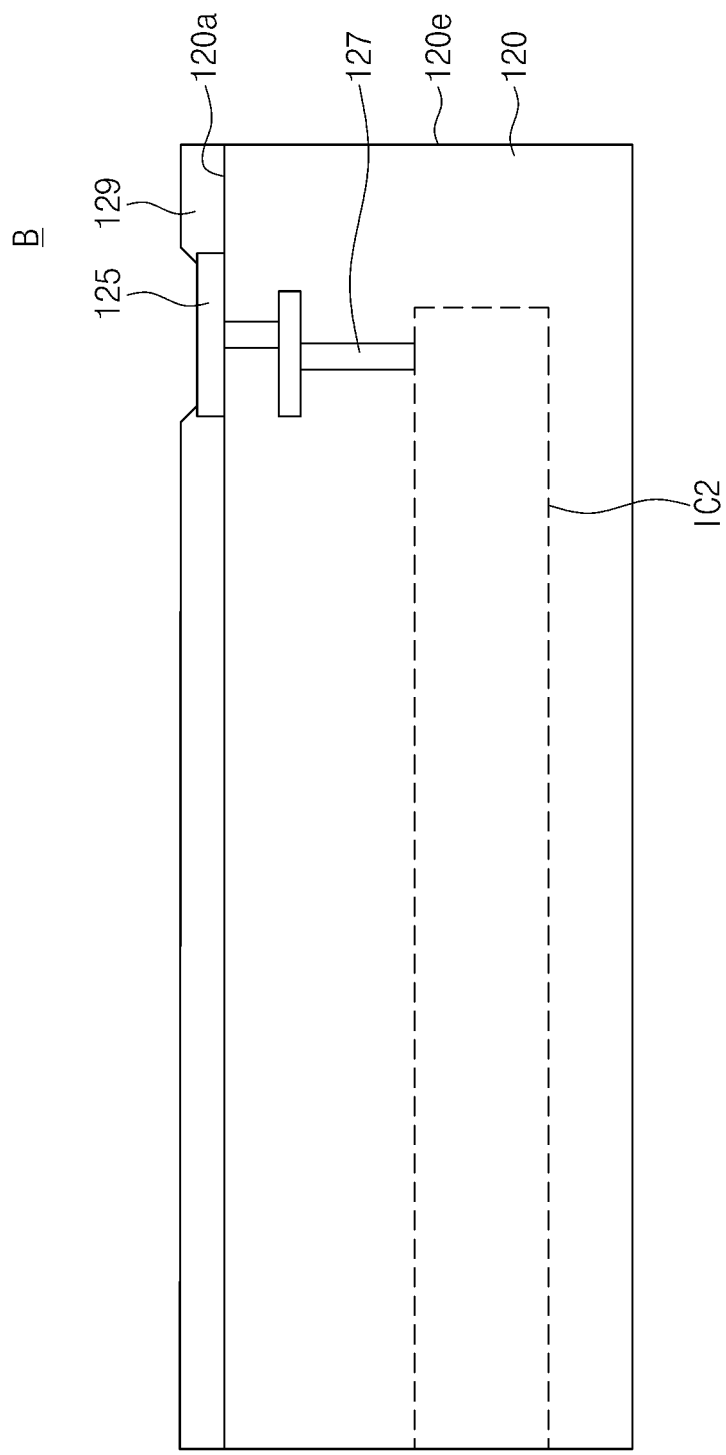
Figure 3D:
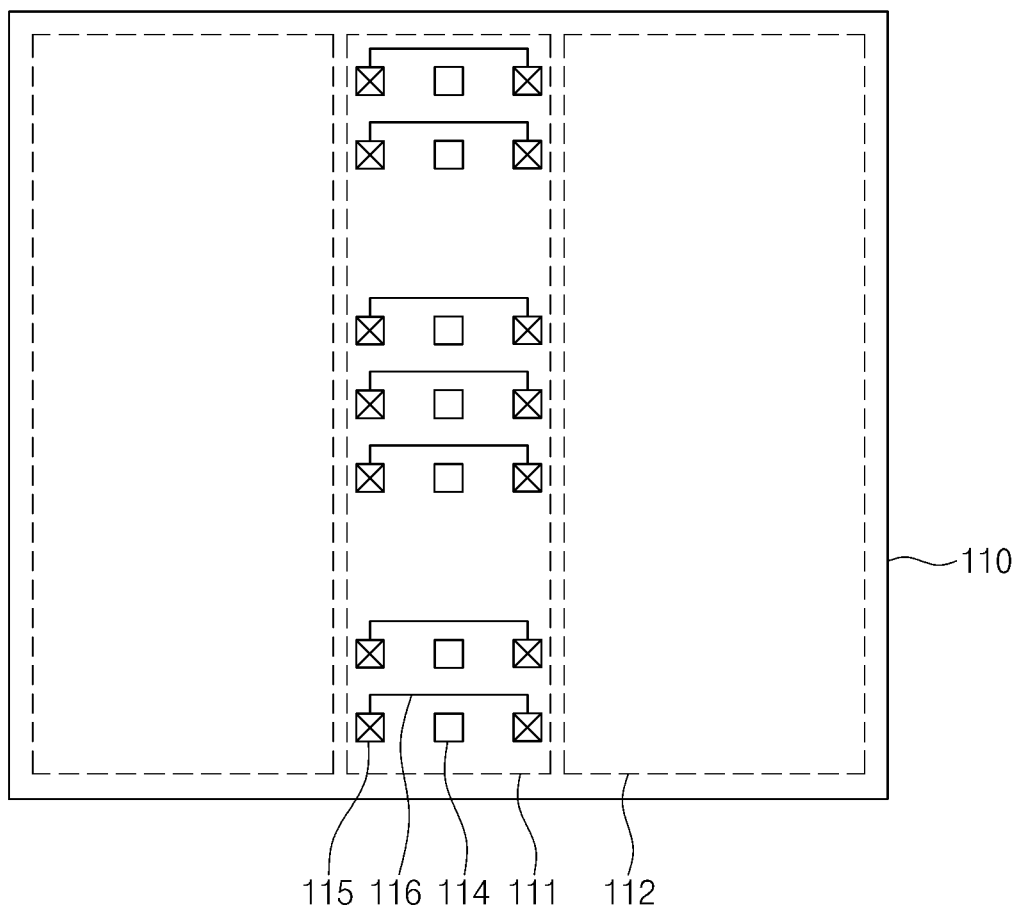
FIG. 3D is a schematic plan view illustrating a bottom surface of a first semiconductor chip 110.
Figure 3E:
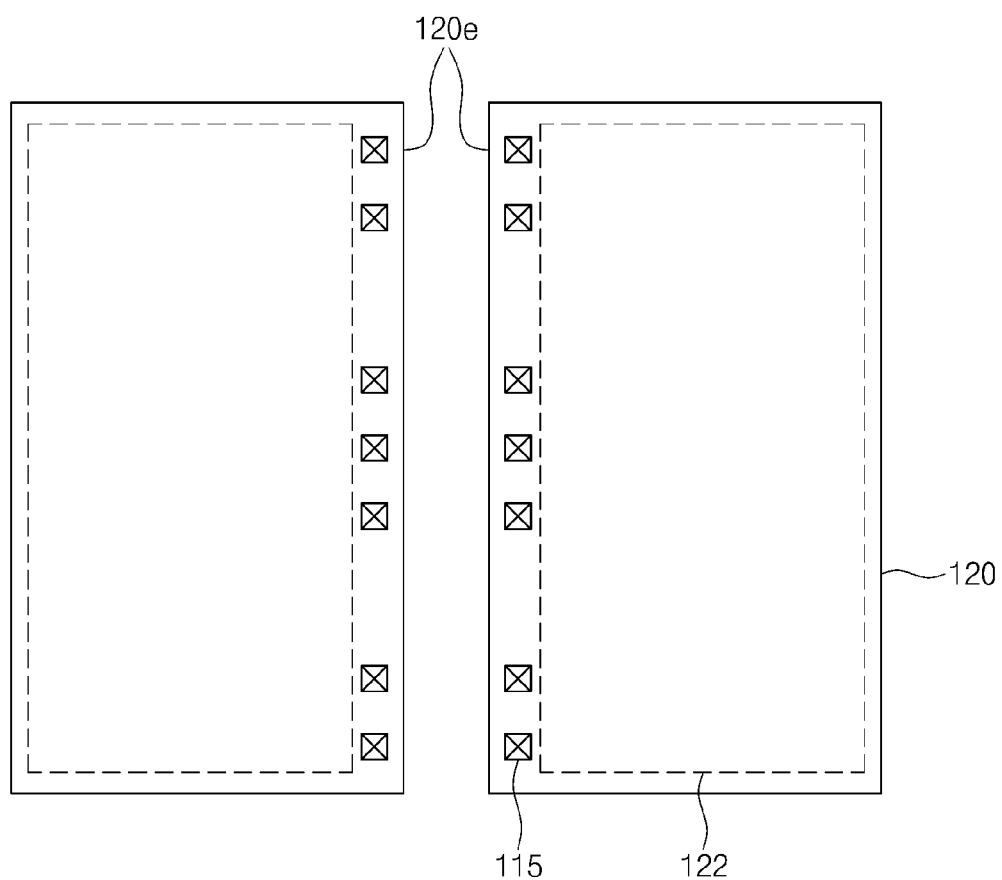
FIG. 3E is a schematic plan view illustrating top surfaces of second semiconductor chips 120.

A semiconductor package 2 according to a second embodiment of the inventive concepts will now be described with reference to FIGS. 3A through 3E. FIG. 3A is a schematic cross-sectional view of a semiconductor package 2 according to a second embodiment of the inventive concepts. FIGS. 3B and 3C are enlarged views illustrating portions A and B, respectively, of the semiconductor package 2 of FIG. 3A. FIG. 3D is a schematic plan view illustrating a bottom surface of a first semiconductor chip 110, and FIG. 3E is a schematic plan view illustrating top surfaces of second semiconductor chips 120. In the description that follows, discussion of features identical to those of FIGS. 2A through 2E will be minimized in order to avoid redundancy.

Referring to FIGS. 3A through 3E, in the semiconductor package 2, the second integrated circuit IC2 of the second semiconductor chips 120 may be electrically connected to the second bonding pads 125, without the second center pads 124 of the previous embodiment. In other words, the semiconductor package 2 of this embodiment may differ from the semiconductor package 1 of the previous embodiment in that the second integrated circuit IC2 may be directly connected to edge pads (e.g., the second bonding pads 125), which may be provided adjacent to edge portions 120e of the second semiconductor chips 120.

Figure 4B:
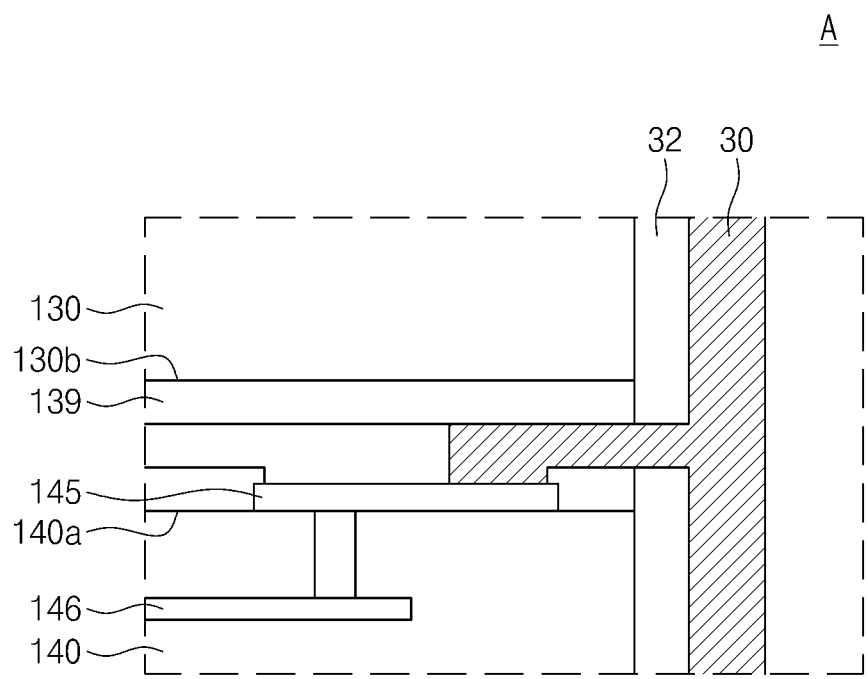
FIG. 4B is an enlarged view of a portion A of FIG. 4A.

A semiconductor package 3 according to a third embodiment of the inventive concepts will now be described with reference to FIGS. 4A and 4B. FIG. 4A provides a schematic cross-sectional view of a semiconductor package 3 according to a third embodiment, and FIG. 4B is an enlarged view of portion A of FIG. 4A. Discussion of features identical to those of FIGS. 2A through 2E will be minimized in order to avoid redundancy.

Referring to FIGS. 4A and 4B, the semiconductor package 3 may include a package substrate 100, a first semiconductor chip 110 on the package substrate 100, and a pair of second semiconductor chips 120 spaced apart from each other across the opening 101 and disposed between the package substrate 100 and the first semiconductor chip 110. In addition, however, a pair of third semiconductor chips 130 may be spaced apart from each other across the opening 101 and disposed between the package substrate 100 and the second semiconductor chips 120, and a pair of fourth semiconductor chips 140 may be spaced apart from each other across the opening 101 and disposed between the package substrate 100 and the third semiconductor chips 130.

Each of the third semiconductor chips 130 may include a fifth surface 130a facing the second semiconductor chip 120 and a sixth surface 130b opposite the fifth surface. One or more of the third semiconductor chips 130 may include a third integrated circuit, third center pads 134 and third bonding pads 135. A third insulating layer 139 may be formed on the sixth surface 130b of the third semiconductor chips 130.

Similar to the second integrated circuit IC2 shown in FIG. 2C, the third integrated circuit may be provided in the third semiconductor chips 130 adjacent to the fifth surface 130a. The third center pads 134 and the third bonding pads 135 may be provided on the fifth surface 130a of the third semiconductor chip 130. The third center pads 134 may be provided in a central region of the third semiconductor chip 130. The third bonding pads 135 may be disposed adjacent to edge portions 130e of the third semiconductor chips 130. The third bonding pads 135 may be provided to correspond to the second bonding pads 125 and be electrically connected to the third center pads 134 via a third redistributed line 136. Accordingly, the third bonding pads 135 may be electrically connected to the third integrated circuit via the third center pads 134.

Each of the fourth semiconductor chips 140 may include a seventh surface 140a facing the corresponding third semiconductor chip 130 and an eighth surface 140b opposite the seventh surface 140a. One or more of the fourth semiconductor chips 140 may include a fourth integrated circuit, fourth center pads 144, and fourth bonding pads 145.

Similar to the second integrated circuit IC2 shown in FIG. 2C, the fourth integrated circuit may be provided in the fourth semiconductor chip 140 adjacent to the seventh surface 140a. The fourth center pads 144 and the fourth bonding pads 145 may be disposed on the seventh surface 140a of the fourth semiconductor chip 140. The fourth center pads 144 may be provided in a central region of the fourth semiconductor chip 140. The fourth bonding pads 145 may be disposed adjacent to edge portions 140e of the fourth semiconductor chips 140. The fourth bonding pads 145 may be provided to correspond to the third bonding pads 135 and be electrically connected to the fourth center pads 144 via a fourth redistributed line 146. Accordingly, the fourth bonding pads 145 may be electrically connected to the fourth integrated circuit via the fourth center pads 144.

The second semiconductor chips 120, the third semiconductor chips 130, the fourth semiconductor chips 140, and the package substrate 100 may be attached to each other by adhesive layers 210.

The second bonding pads 125, the third bonding pads 135, and the fourth bonding pads 145 may be connected to each other in a side connection manner. For example, as shown in FIG. 4B, a sidewall insulating layer 32 may be formed on a sidewall of the second semiconductor chip 120, the third semiconductor chip 130, and the fourth semiconductor chip 140, and a metal pattern 30 may be formed on the sidewall insulating layer 32. The metal pattern 30 extend laterally and be electrically connected to the second 125, third 135 and fourth bonding pads 145. For example, the metal pattern 30 may extend laterally between the second, third, and fourth semiconductor chips 120, 130, and 140. The metal pattern 30 may, for example, include copper (Cu).

A semiconductor package 4 according to a fourth embodiment of the inventive concepts will now be described with reference to FIG. 5. FIG. 5 is a schematic cross-sectional view of a semiconductor package 4 according to a fourth embodiment. In the description that follows, discussion of features identical to those of FIG. 4A will be minimized in order to avoid redundancy.

Referring to FIG. 5, unlike the previous embodiment, the third semiconductor chips 130 of this embodiment may be shifted toward an outer edge of the package substrate 100 to expose the fourth bonding pads 145 of the fourth semiconductor chips 140. Similarly, the second semiconductor chips 120 may be shifted toward the outer edge of the package substrate 100 to expose the third bonding pads 135 of the third semiconductor chips 130.

A first subwire 42 may be provided in the opening 101 to electrically connect the second bonding pads 125 with the third bonding pads 135. A second subwire 44 may be provided in the opening 101 to electrically connect the third bonding pads 135 with the fourth bonding pads 145.

Figure 6B:
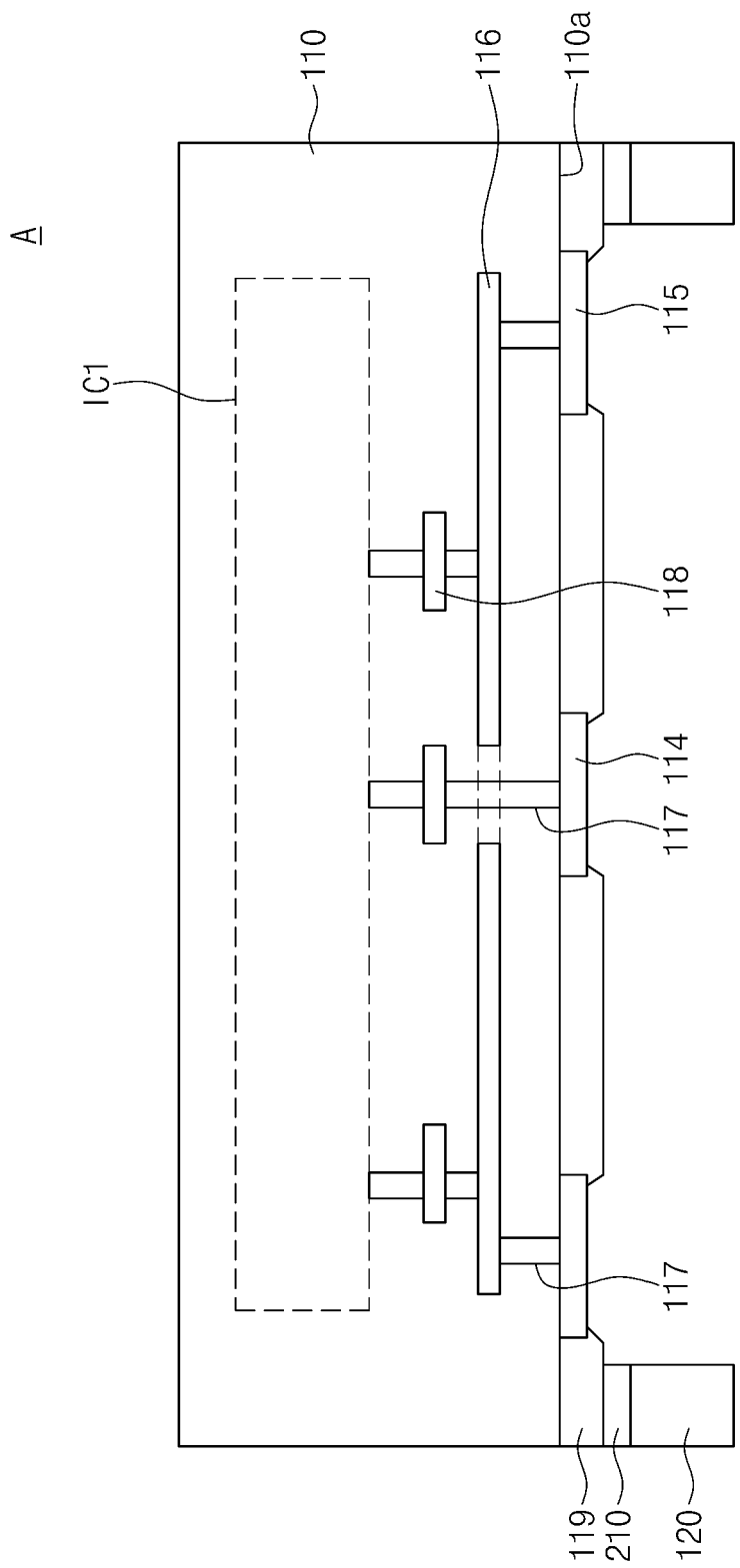
FIGS. 6B and 6C are enlarged views illustrating portions A and B of FIG. 6A, respectively.
Figure 6C:
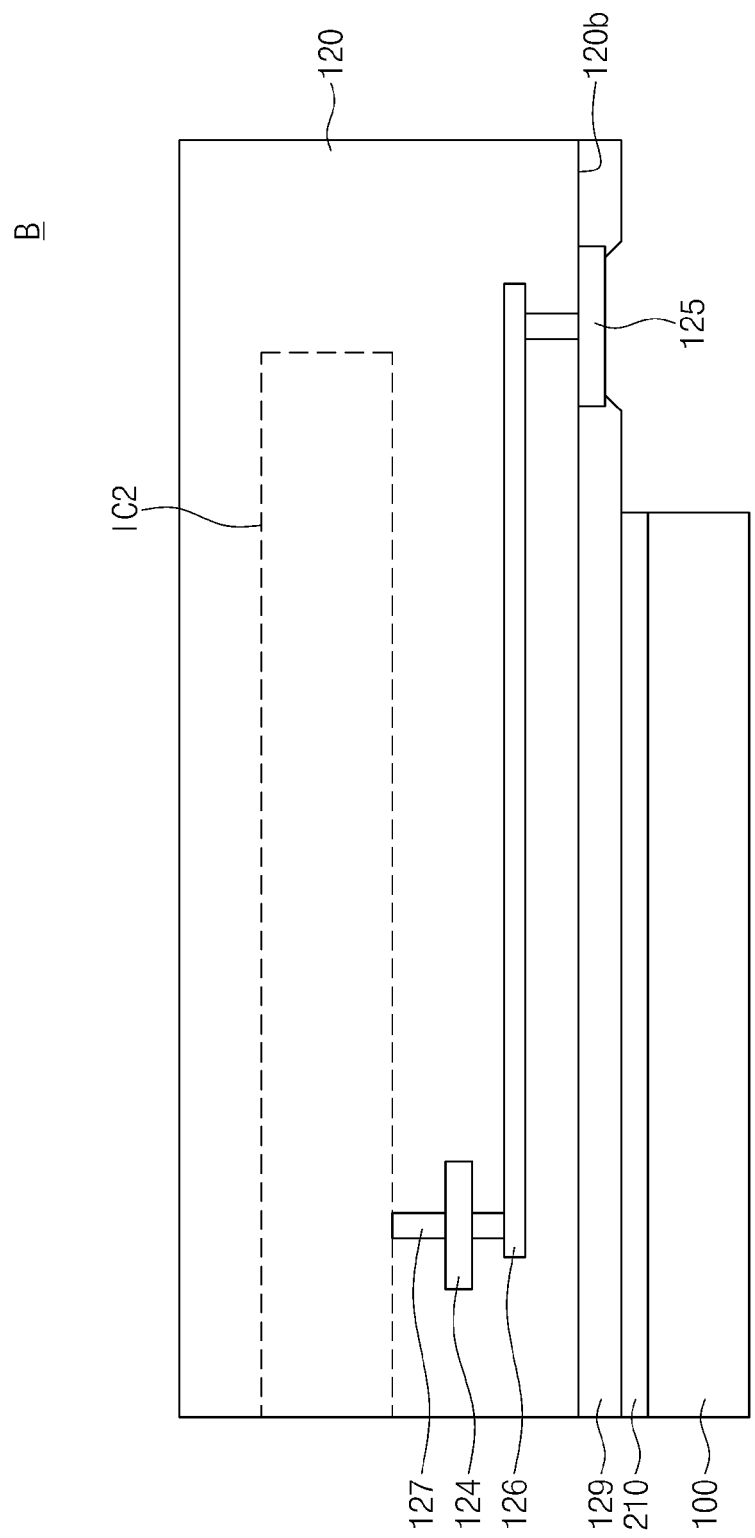

A semiconductor package 5 according to a fifth embodiment of the inventive concepts will now be described with reference to FIGS. 6A through 6C. FIG. 6A is a schematic cross-sectional view of a semiconductor package 5 according to a fifth embodiment of the inventive concepts, and FIGS. 6B and 6C are enlarged views of portions A and B, respectively, of FIG. 6A, respectively. In the description that follows, discussion of features identical to those of FIGS. 2A through 2E will be minimized in order to avoid redundancy.

Referring to FIGS. 6A through 6C, unlike the first embodiment, second integrated circuits IC2 of second semiconductor chips 120 in this embodiment may be formed in the second semiconductor chips 120 adjacent to the fourth surfaces 120b. The second center pads 124 and the second bonding pads 125 may be provided on the fourth surface 120b of the second semiconductor chip 120. The second center pads 124 may be provided in the central region of the second semiconductor chip 120. The second bonding pads 125 may be disposed adjacent to edge portions 120e of the second semiconductor chips 120. The second bonding pads 125 may be provided to correspond to the first bonding pads 115 and be electrically connected to the second center pads 124 via a second redistributed line 126. The second center pads 124 may be electrically connected to the second integrated circuit IC2 via a second contact 127. The second insulating layer 129 may be provided on the fourth surface 120b of the second semiconductor chip 120 to cover the fourth surface 120b and expose the second bonding pads 125.

The package substrate 100 and the first and second semiconductor chips 110 and 120 may be attached to each other by adhesive layers 210. The adhesive layers 210 may be an insulating film or tape, which may be formed of epoxy or silicone.

The second semiconductor chips 120 may be shifted toward the opening 101 to expose the second bonding pads 125 of second semiconductor chips. The second semiconductor chips 120 may be arranged to expose the first bonding pads 115. A first subwire 42 may be provided in the opening 101 to electrically connect the first bonding pads 115 with the second bonding pads 125.

Figure 7:
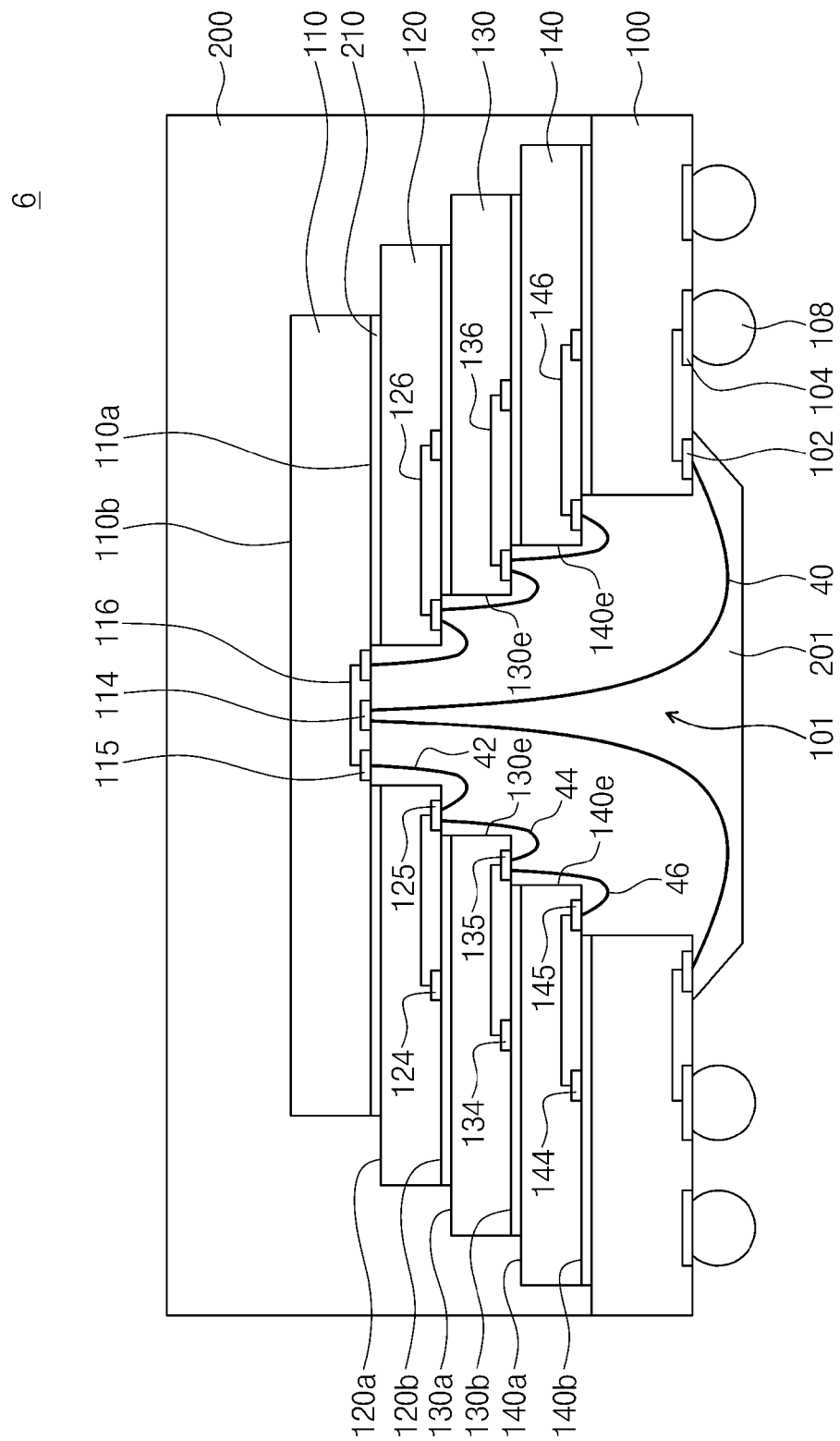
FIG. 7 is a sectional view of a semiconductor package according to a sixth embodiment of the inventive concepts.

A semiconductor package 6 according to a sixth embodiment of the inventive concepts will now be described with reference to FIG. 7. FIG. 7 is a schematic cross-sectional view of a semiconductor package 6 according to a sixth embodiment. In the description that follows, discussion of features identical to those of FIGS. 6A through 6C will be minimized in order to avoid redundancy.

Referring to FIG. 7, a semiconductor package 6 may include a pair of third semiconductor chips 130 spaced apart from each other and disposed between the package substrate 100 and the second semiconductor chips 120, along with a pair of fourth semiconductor chips 140 spaced apart from each other and disposed between the package substrate 100 and the third semiconductor chips 130.

One or more of the third semiconductor chips 130 may include a third integrated circuit, a third center pad 134, and a third bonding pad 135. Each of the third semiconductor chips 130 may include a fifth surface 130a facing the second semiconductor chips 120 and a sixth surface 130b opposite the fifth surface 130a.

Similar to the second integrated circuit IC2 shown in FIG. 6C, the third integrated circuit may be provided in the third semiconductor chip 130 adjacent to the sixth surface 130b. The third center pad 134 and the third bonding pad 135 may be provided on the sixth surface 130b of the third semiconductor chip 130. The third center pads 134 may be provided in the central region of the corresponding third semiconductor chip 130. The third bonding pads 135 may be disposed adjacent to edge portions 130e of the third semiconductor chips 130. The third bonding pads 135 may be provided to correspond to the second bonding pads 125 and be electrically connected to the third center pads 134 via a third redistributed line 136. Accordingly, the third bonding pads 135 may be electrically connected to the third integrated circuit via the third center pads 134.

One or more of the fourth semiconductor chips 140 may include a fourth integrated circuit, a third center pad 144, and a fourth bonding pad 145. Each of the fourth semiconductor chips 140 may include a seventh surface 140a facing the third semiconductor chips 130 and an eighth surface 140b opposite the seventh surface 140a.

Similar to the second integrated circuit IC2 shown in FIG. 6C, the fourth integrated circuit may be provided in the fourth semiconductor chip 140 adjacent to the eighth surface 140b. The fourth center pad 144 and the fourth bonding pad 145 may be provided on the eighth surface 140b of the fourth semiconductor chip 140. The fourth center pad 144 may be provided in a central region of the fourth semiconductor chip 140. The fourth bonding pads 145 may be disposed adjacent to edge portions 140e of the fourth semiconductor chips 140. The fourth bonding pads 145 may be provided to correspond to the third bonding pads 135 and be electrically connected to the fourth center pads 144 via a fourth redistributed line 146. Accordingly, the fourth bonding pads 145 may be electrically connected to the fourth integrated circuits via the fourth center pads 144.

The third semiconductor chips 130 may be shifted toward the opening 101 to expose the third bonding pads 135 of the third semiconductor chips. The fourth semiconductor chips 140 may be shifted toward the opening 101 to expose the fourth bonding pads 145 of the fourth semiconductor chips.

A second subwire 44 may be provided in the opening 101 to electrically connect the second bonding pad 125 with a corresponding third bonding pad 135. A third subwire 46 may be provided in the opening 101 to electrically connect a third bonding pad 135 with a corresponding fourth bonding pad 145.

Figure 8A:
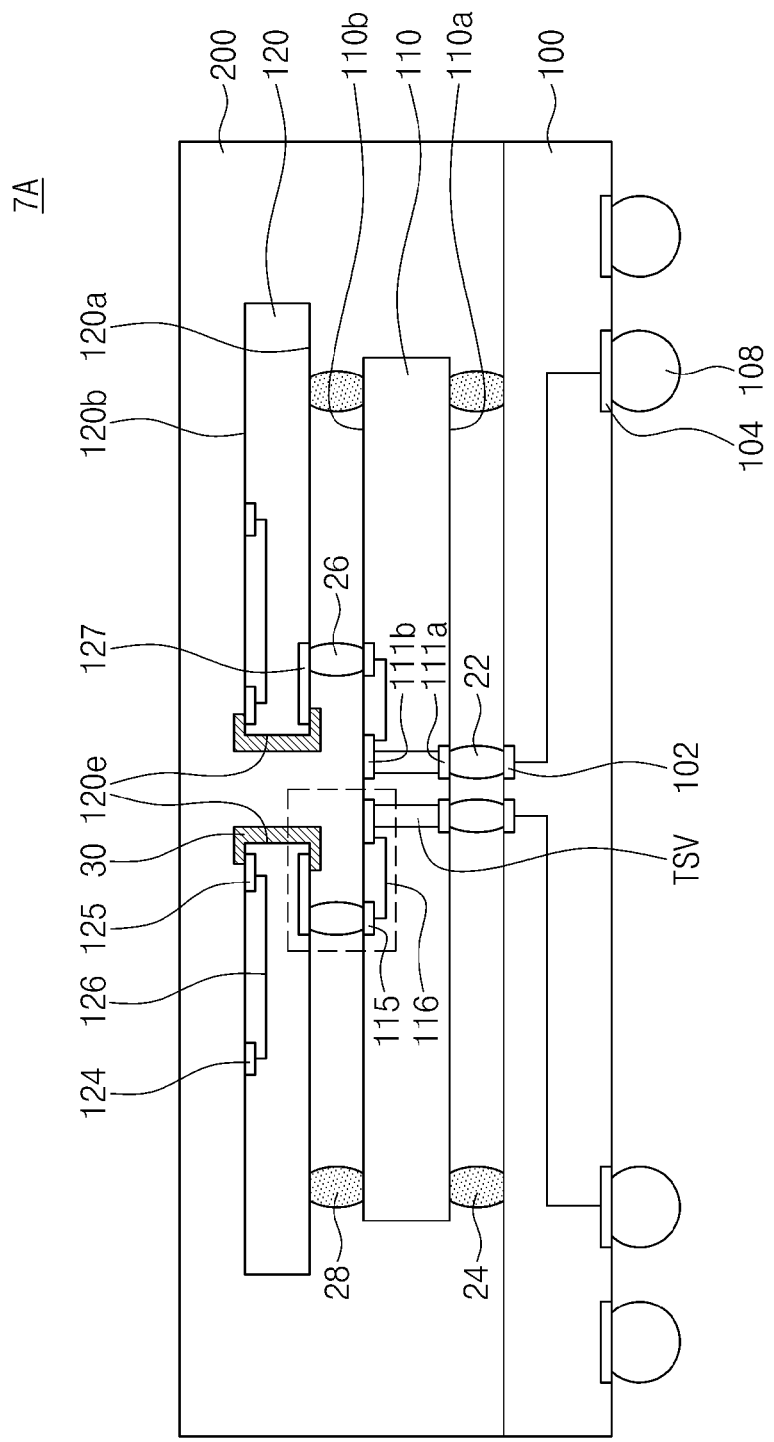
FIG. 8A is a sectional view of a semiconductor package according to a seventh embodiment of the inventive concepts.

A semiconductor package 7A according to a seventh embodiment of the inventive concepts will now be described with reference to FIGS. 8A and 8B. FIG. 8A is a schematic cross-sectional view of a semiconductor package 7A according to a seventh embodiment of the inventive concepts, and FIG. 8B is an enlarged view of a portion A of FIG. 8A.

Figure 8B:
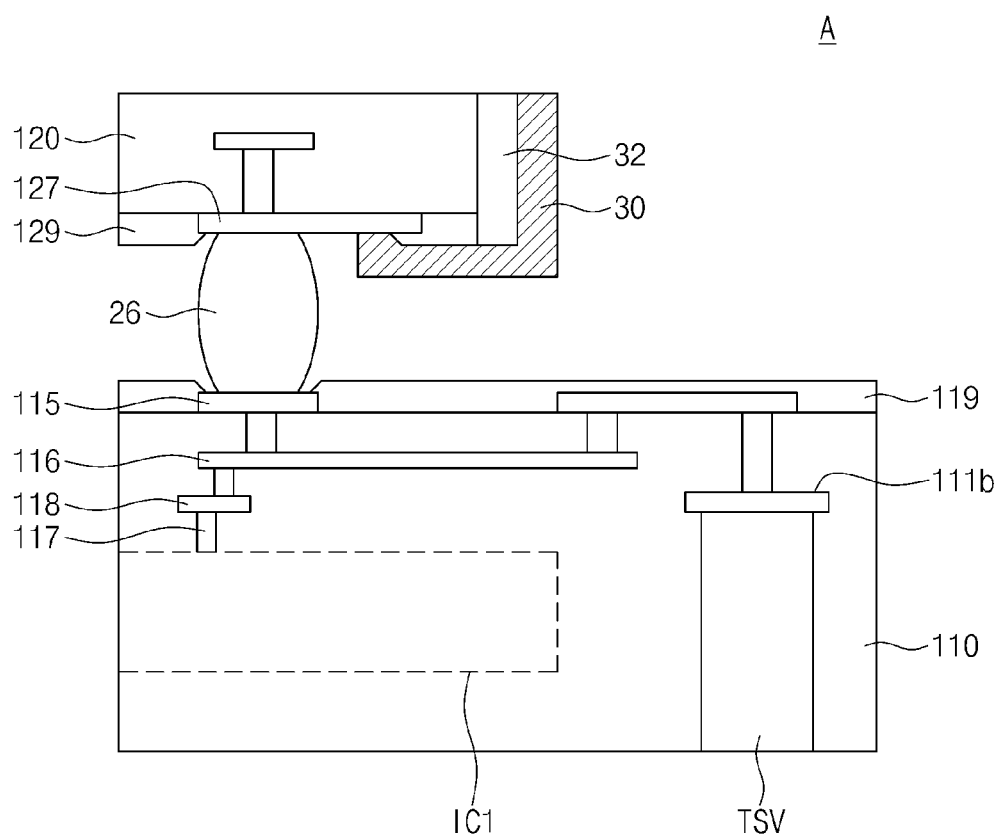
FIG. 8B is an enlarged view of a portion A of FIG. 8A.

Referring to FIGS. 8A and 8B, the semiconductor package 7A may include a package substrate 100 with a circuit pattern, a first semiconductor chip 110 on the package substrate, and a pair of second semiconductor chips 120 provided spaced apart from each other on the first semiconductor chip 110.

The package substrate 100 may be a printed circuit board. The package substrate 100 may include the circuit pattern 102. The circuit pattern 102 may be electrically connected to an external pad 104, which may be disposed on the bottom surface of the package substrate 100. To electrically connect the semiconductor package 6 to an external device, at least one external terminal 108 (e.g., a solder bump or a solder ball) may be provided on the external pad 104.

The first semiconductor chip 110 may include a first surface 110a facing the package substrate 100 and a second surface 110b opposite the first surface. Each first semiconductor chip 110 may include a first integrated circuit IC1, through-silicon vias TSV, and a first bonding pad 115. The first integrated circuit IC1 may be formed in the first semiconductor chip 110 adjacent to the second surface 110b.

The through-silicon vias TSV may be provided in the central region of the first semiconductor chip 110. The through-silicon vias TSV may be formed to penetrate the first semiconductor chip 110 or a substrate thereof. The first semiconductor chip 110 may include a lower pad 111a and an upper pad 111b that are provided on the first and second surfaces 110a and 110b, respectively, and are connected to each other by the through-silicon vias TSV.

The first bonding pads 115 may be provided in a central region of the first semiconductor chip 110, but spaced apart from the through-silicon vias TSV. In example embodiments, the first bonding pads 115 may be provided on the second surface 110b of the first semiconductor chip 110. The first bonding pads 115 may be electrically connected to the first integrated circuit IC1 via the first contact 117 and the first internal pad 118. In example embodiments, a pair of first bonding pads 115 may be provided with the through-silicon vias TSV interposed therebetween. The first bonding pads 115 may be electrically connected to the through-silicon via TSV via the first redistributed line 116. The first insulating layer 119 may be provided on the second surface 110b of the first semiconductor chip 110 to expose the first bonding pads 115.

First bumpers 22 may be provided between the first semiconductor chip 110 and the package substrate 100 to electrically connect the through-silicon via TSV to the circuit pattern 102. The semiconductor package 6 may further include first dummy bumpers 24 that are spaced apart from the first bumpers 22 to support the first semiconductor chip 110 and the package substrate 100.

A pair of second semiconductor chips 120 may be provided spaced apart from each other to expose the central region of the first semiconductor chip 110. Opposite edge portions 120e of the second semiconductor chips 120 may be disposed adjacent to the central region of the first semiconductor chip 110. Each of the second semiconductor chips 120 may include a third surface 120a facing the first semiconductor chip 110 and a fourth surface 120b opposite the third surface. Each second semiconductor chip 120 may include a second integrated circuit, a second center pad 124, and a second bonding pad 125.

Each second integrated circuit may be formed in a corresponding second semiconductor chip 120 adjacent to the fourth surface 120b, as shown in FIG. 2C. The second center pads 124 may be disposed in the central region of the respective second semiconductor chip 120. The second bonding pads 125 may be disposed adjacent to edge portions 120e of the second semiconductor chips 120. The second center pads 124 and the second bonding pads 125 may be disposed on the fourth surfaces 120b of the second semiconductor chips 120. The second bonding pads 125 may be electrically connected to the second center pads 124 via the second redistributed lines 126. The second center pads 124 may be electrically connected to the second integrated circuits IC2. Accordingly, the second bonding pads 125 may be electrically connected to the second integrated circuits IC2 via the second center pads 124.

Connection pads 127 may be provided on the third surfaces 120a of the second semiconductor chips 120. The connection pads 127 may be provided to correspond to the second bonding pads 125. A second insulating layer 129 may be provided on the third surface 120a of the second semiconductor chip 120 to cover the third surface and expose the connection pad 127.

The second bonding pads 125 and the connection pads 127 may be connected to each other in a side connection manner. For example, as illustrated in FIG. 8B, a sidewall insulating layer 32 may be formed on a sidewall of each second semiconductor chip 120, and a metal pattern 30 may be formed on the sidewall insulating layer 32. The metal pattern 30 may extend toward the third surface 120a and the fourth surface 120b of the second semiconductor chip 120 and be electrically connected to the second bonding pad 125 and the connection pad 127. The metal pattern 30 may, for example, include copper (Cu).

Second bumpers 26 may be provided between the first semiconductor chip 110 and the second semiconductor chips 120 to connect the connection pads 127 with the first bonding pads 115. The semiconductor package 6 may further include second dummy bumpers 28 that are provided spaced apart from the second bumpers 26 to support the first semiconductor chip 110 and the second semiconductor chips 120.

A semiconductor package 7B, according to a modification of the seventh embodiment of the inventive concepts, will now be described with reference to FIG. 9. Discussion of features identical to those of FIGS. 8A and 8B will be minimized in order to avoid redundancy.

Figure 9:
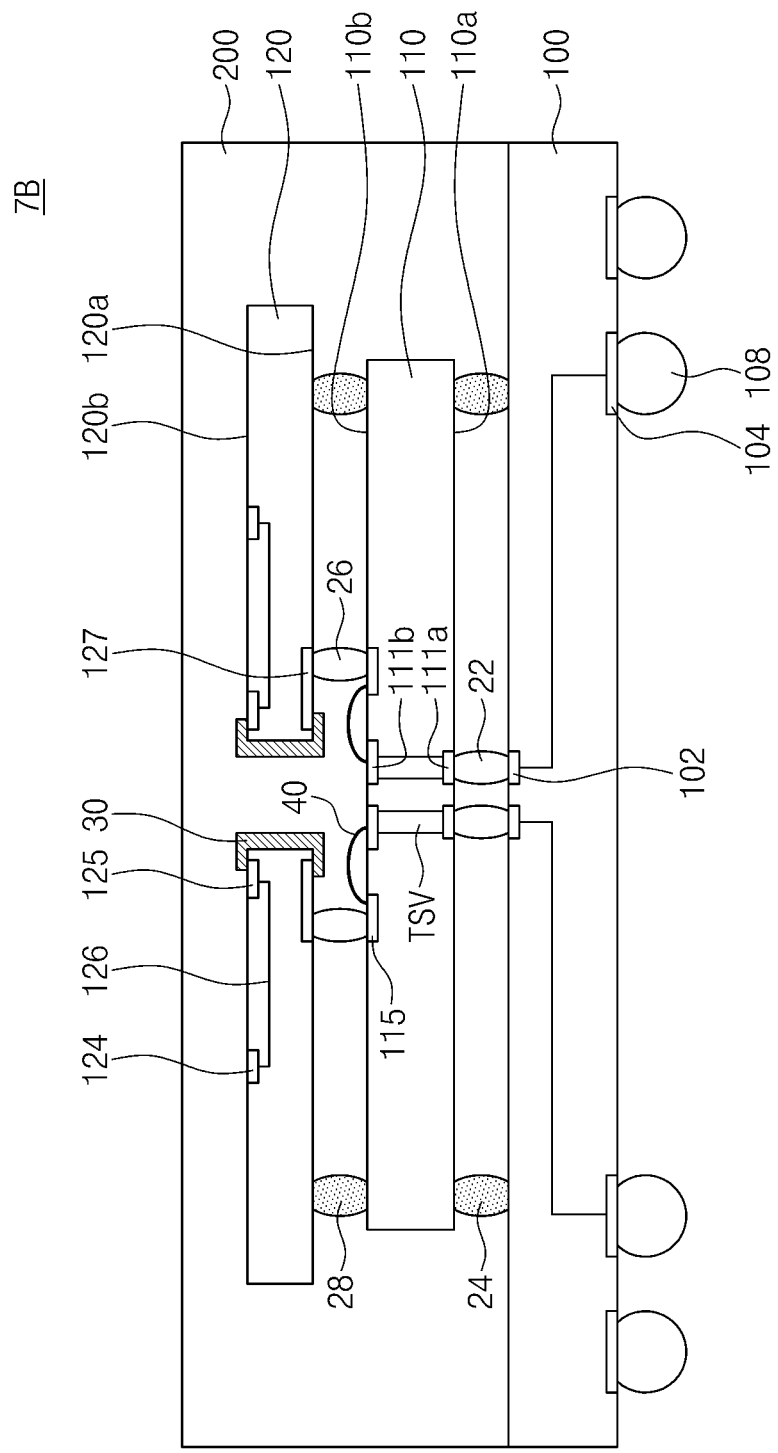
FIG. 9 is a sectional view of a semiconductor package according to a modification of the seventh embodiment of the inventive concepts.

Referring to FIG. 9, unlike the semiconductor package 7A, the semiconductor package 7B may be configured to include first bonding pads 115 electrically connected to the through-silicon via TSV by a bonding wire 40, rather than by the first redistributed line 116.

A semiconductor package 8, according to an eighth embodiment of the inventive concepts, will now be described with reference to FIG. 10. Discussion of features identical to those of FIGS. 8A and 8B will again be minimized in order to avoid redundancy.

Figure 10:
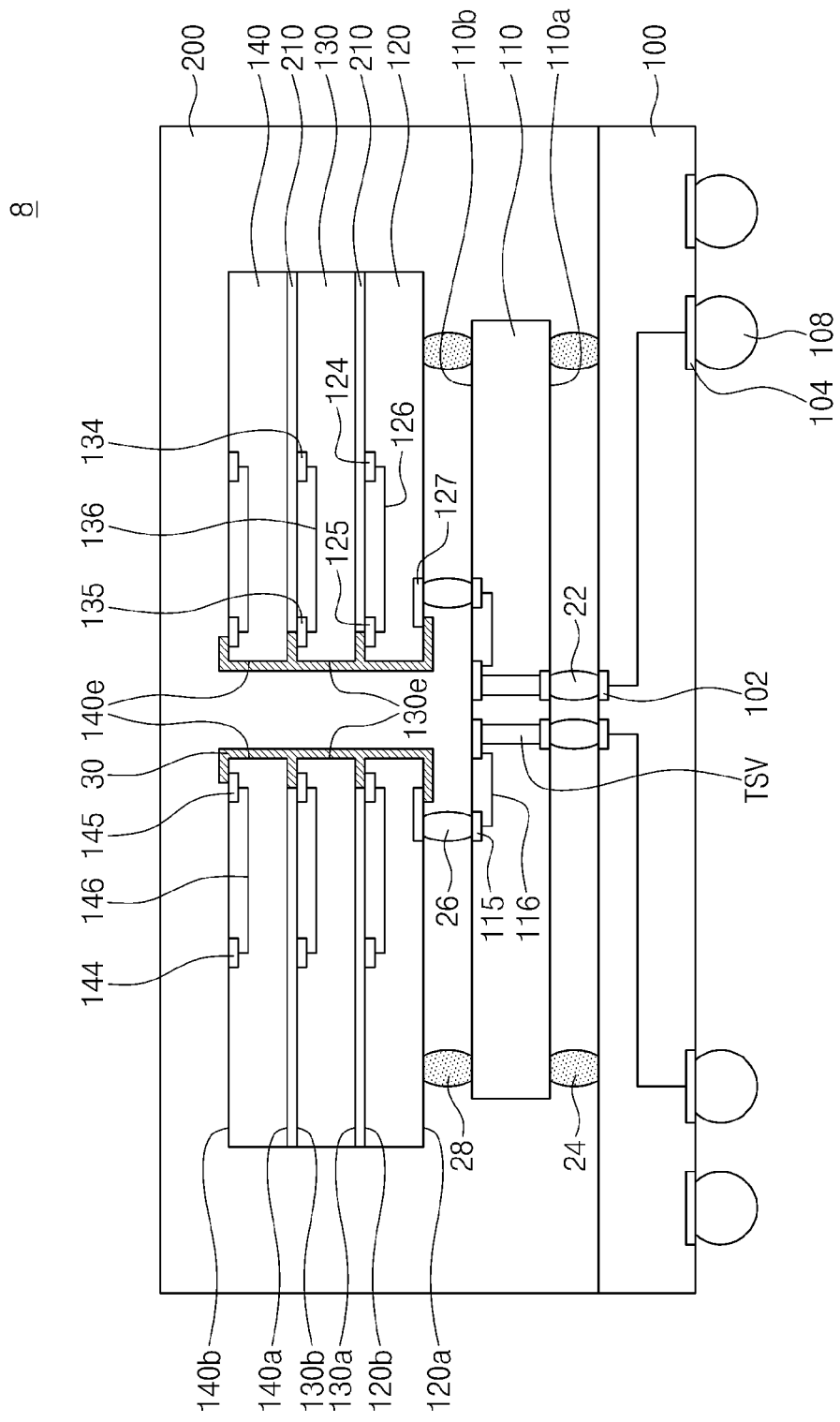
FIG. 10 is a sectional view of a semiconductor package according to an eighth embodiment of the inventive concepts.

Referring to FIG. 10, a semiconductor package 8 may include a package substrate 100, a first semiconductor chip 110 arranged on the package substrate 100, a pair of second semiconductor chips 120 spaced apart from each other and disposed between the package substrate 100 and the first semiconductor chip 110, a pair of third semiconductor chips 130 spaced apart from each other and disposed on the second semiconductor chips 120, and a pair of fourth semiconductor chips 140 spaced apart from each other and disposed on the third semiconductor chips 130.

One or more of the third semiconductor chips 130 may include a third integrated circuit, a third center pad 134, and a third bonding pad 135. Each of the third semiconductor chips 130 may include a fifth surface 130a facing the second semiconductor chips 120 and a sixth surface 130b opposite the fifth surface 130a.

Similar to the second integrated circuit IC2 shown in FIG. 2C, the third integrated circuit may be provided in the third semiconductor chips 130 adjacent to the sixth surface 130b. The third center pads 134 and the third bonding pads 135 may be provided on the sixth surfaces 130b of the third semiconductor chips 130. The third center pads 134 may be provided in a central region of the third semiconductor chips 130. The third bonding pads 135 may be disposed adjacent to edge portions 130e of the third semiconductor chips 130. The third bonding pads 135 may be provided to correspond to the second bonding pads 125 and be electrically connected to the third center pads 134 via the third redistributed lines 136. Accordingly, the third bonding pads 135 may be electrically connected to the third integrated circuits via the third center pads 134.

One or more of the fourth semiconductor chips 140 may include a fourth integrated circuit, a fourth center pad 144, and a fourth bonding pad 145. Each of the fourth semiconductor chips 140 may include a seventh surface 140a facing a corresponding one of the third semiconductor chips 130 and an eighth surface 140b opposite the seventh surface 140a.

Similar to the second integrated circuit IC2 shown in FIG. 2C, the fourth integrated circuit may be provided in the fourth semiconductor chip 140 adjacent to the eighth surface 140b. The fourth center pads 144 and the fourth bonding pads 145 may be provided on the eighth surfaces 140b of the fourth semiconductor chips 140. The fourth center pads 144 may be provided in central regions of the fourth semiconductor chips 140. The fourth bonding pads 145 may be disposed adjacent to edge portions 140e of the fourth semiconductor chips 140. The fourth bonding pads 145 may be provided to correspond to the third bonding pads 135 and be electrically connected to the fourth center pads 144 via the fourth redistributed lines 146. Accordingly, the fourth bonding pads 145 may be electrically connected to the fourth integrated circuits via the fourth center pads 144.

The second semiconductor chips 120, the third semiconductor chips 130, and the fourth semiconductor chips 140 may be attached to each other by the adhesive layers 210.

The connection pads 127, the second bonding pads 125, the third bonding pads 135, and the fourth bonding pads 145 may be connected to each other in a side connection manner. For example, similar to that shown in FIG. 8B, a sidewall insulating layer 32 may be formed on sidewalls of the second, third, and fourth semiconductor chips 120, 130, and 140, and a metal pattern 30 may be formed on the sidewall insulating layer 32. The metal pattern 30 may be connected to the connection pads 127, the second bonding pads 125, the third bonding pads 135, and the fourth bonding pads 145. The metal pattern 30 may, for example, include copper (Cu).

A semiconductor package 9 according to a ninth embodiment of the inventive concepts will be described with reference to FIG. 11. In the description that follows, discussion of features identical to those of FIG. 10 will be minimized in order to avoid redundancy.

Figure 11:
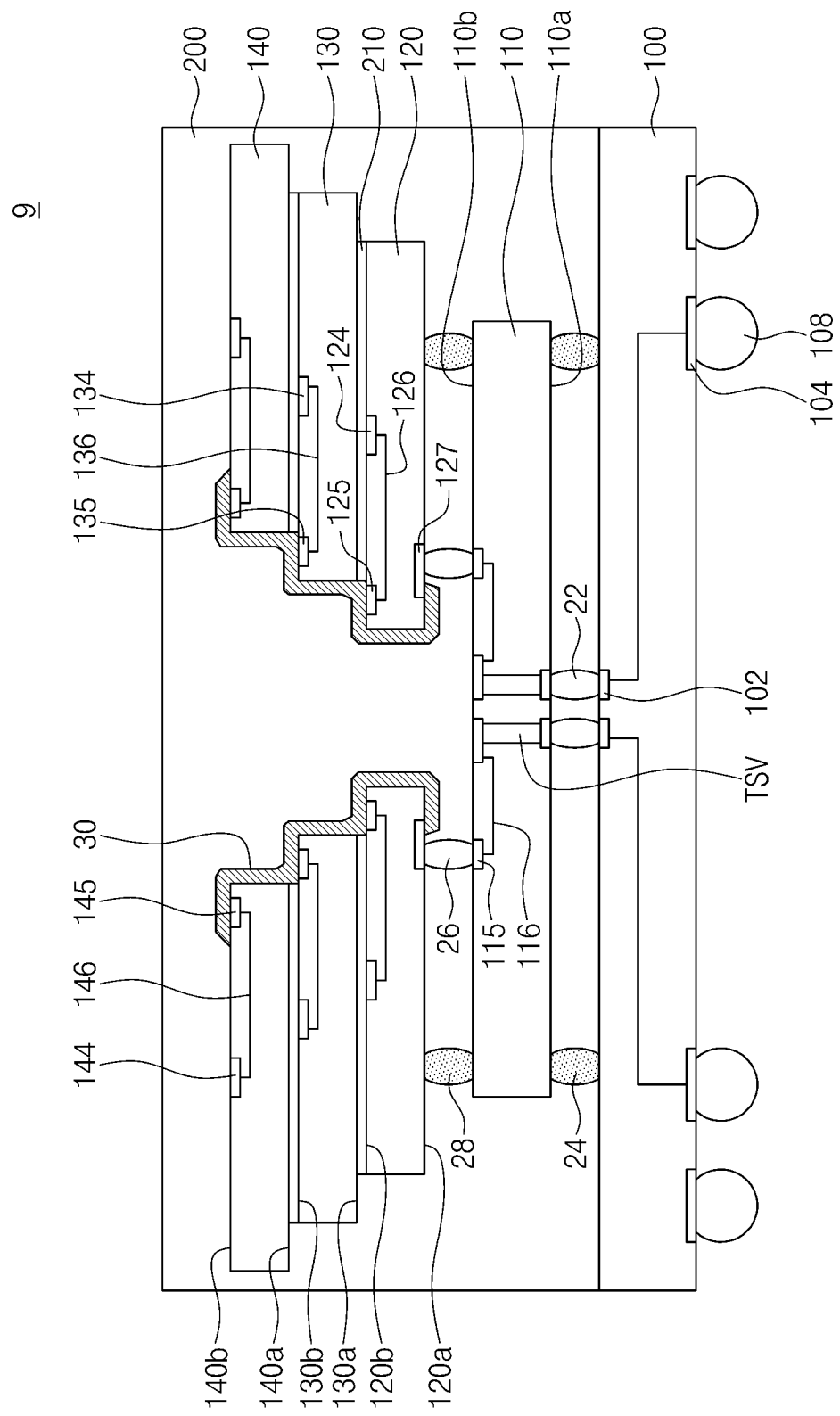
FIG. 11 is a sectional view of a semiconductor package according to a ninth embodiment of the inventive concepts.

Referring to FIG. 11, unlike the embodiment of FIG. 10, the third semiconductor chips 130 may be shifted toward an outer edge of the package substrate 100, as compared to the second semiconductor chips 120, to expose the second bonding pads 125 of the second semiconductor chips 120. Similarly, the fourth semiconductor chips 140 may be shifted toward the outer edge of the package substrate 100 to expose the third bonding pads 135 of the third semiconductor chips 130.

The connection pads 127, the second bonding pads 125, the third bonding pads 135, and the fourth bonding pads 145 may be connected to each other in a side connection manner. The second semiconductor packages 120 may be connected to the first semiconductor package 110 through bumpers 26, 28.

A semiconductor package 10 according to a tenth embodiment of the inventive concepts will now be described with reference to FIG. 12. Discussion of features identical to those of FIG. 11 will be minimized in order to avoid redundancy.

Figure 12:
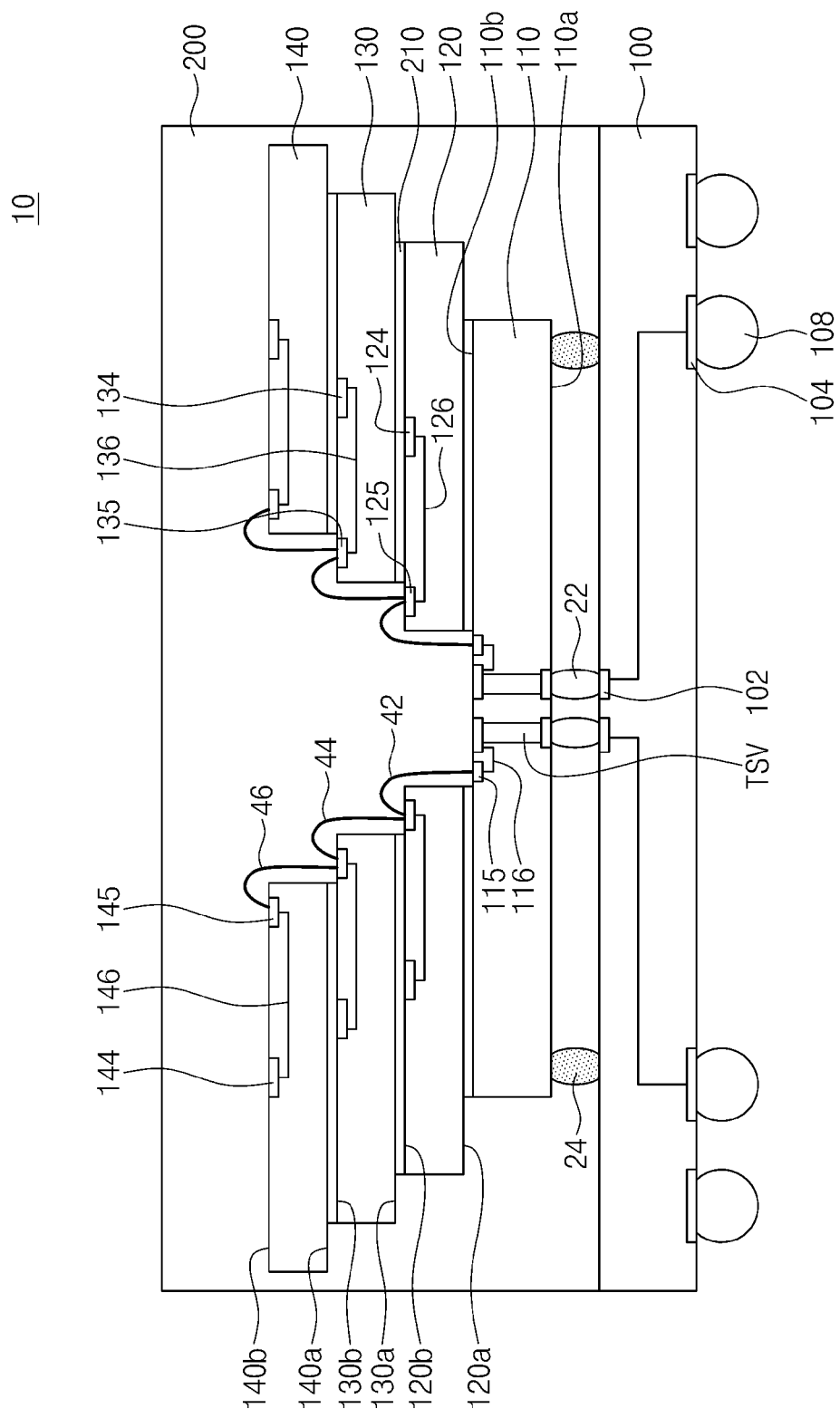
FIG. 12 is a sectional view of a semiconductor package according to a tenth embodiment of the inventive concepts.

Referring to FIG. 12, unlike the embodiment of FIG. 11, the second semiconductor chips 120 may be attached to the first semiconductor package 110 by an adhesive layer 210. The third semiconductor chips 130 may again be shifted toward the outer edge of the package substrate 100 to expose the second bonding pads 125 of the second semiconductor chips 120, and the fourth semiconductor chips 140 may be shifted toward the outer edge of the package substrate 100 to expose the third bonding pads 135 of the third semiconductor chips 130.

The first and second bonding pads 115 and 125, respectively, may be electrically connected to each other via first subwires 42, the second and third bonding pads 125 and 135, respectively, may be electrically connected to each other via second subwires 44, and the third and fourth bonding pads 135 and 145, respectively, may be connected to each other via third subwires 46.

In addition, the seventh, eighth, and ninth embodiments described above may further be modified in such a way that the first bonding pads 115 are connected to the through-silicon via TSV by a main bonding wire 40, rather than by the first redistributed line, as described with reference to FIG. 9.

Figure 13A:
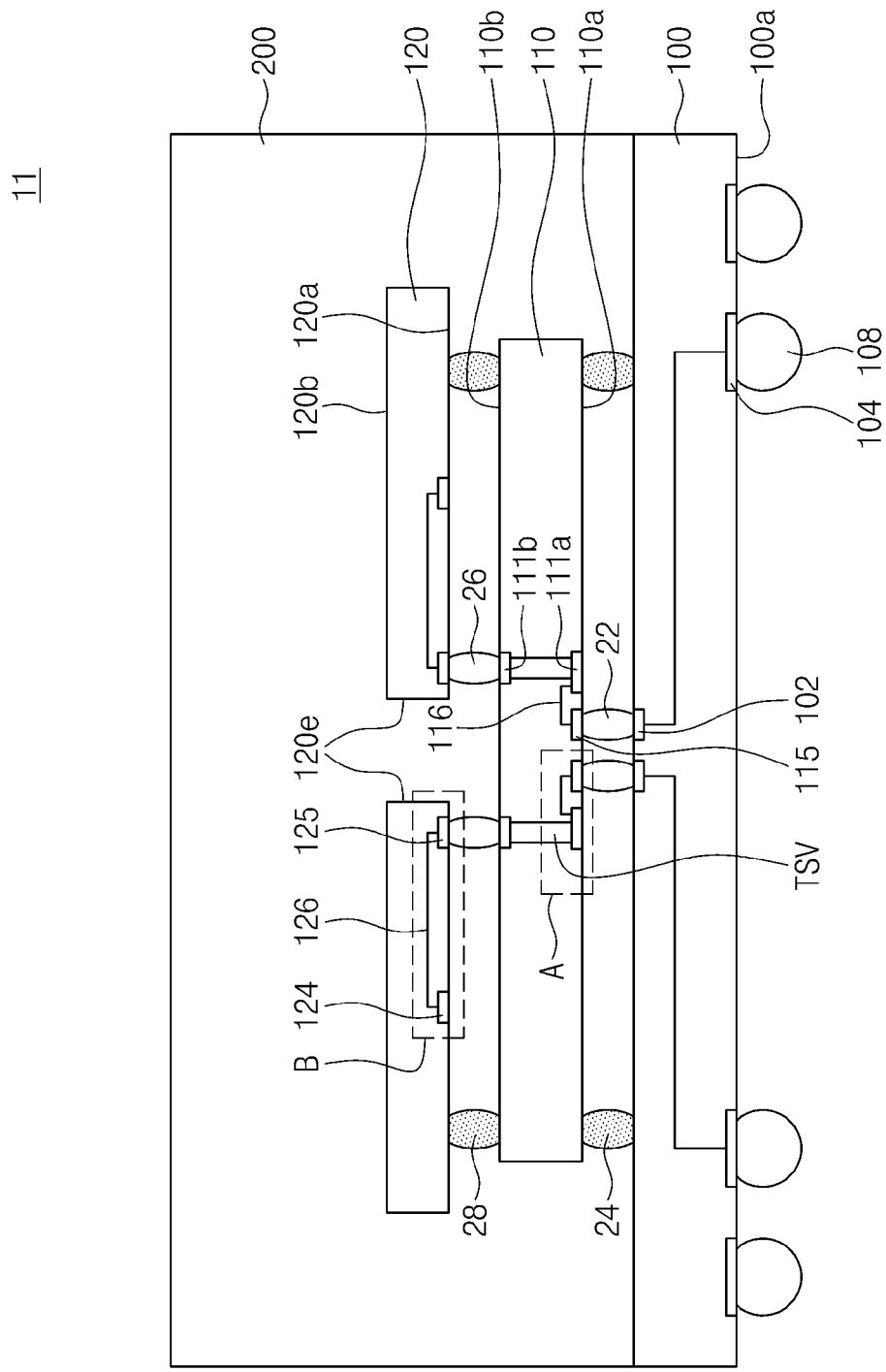
FIG. 13A is a sectional view of a semiconductor package according to an eleventh embodiment of the inventive concepts.

A semiconductor package 11 according to an eleventh embodiment of the inventive concepts will now be described with reference to FIGS. 13A through 13C. FIG. 13A is a schematic cross-sectional view of a semiconductor package 11 according to an eleventh embodiment of the inventive concepts, and FIGS. 13B and 13C are enlarged views illustrating portions A and B, respectively, of FIG. 13A.

Figure 13B:
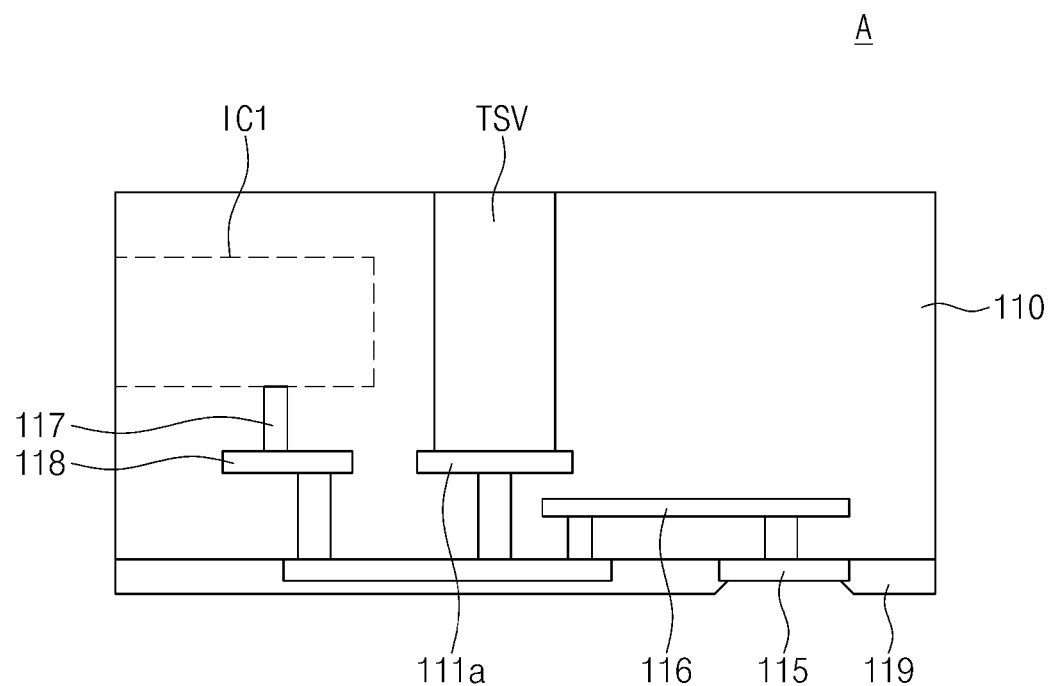
FIGS. 13B and 13C are enlarged views illustrating portions A and B of FIG. 13A, respectively.
Figure 13C:
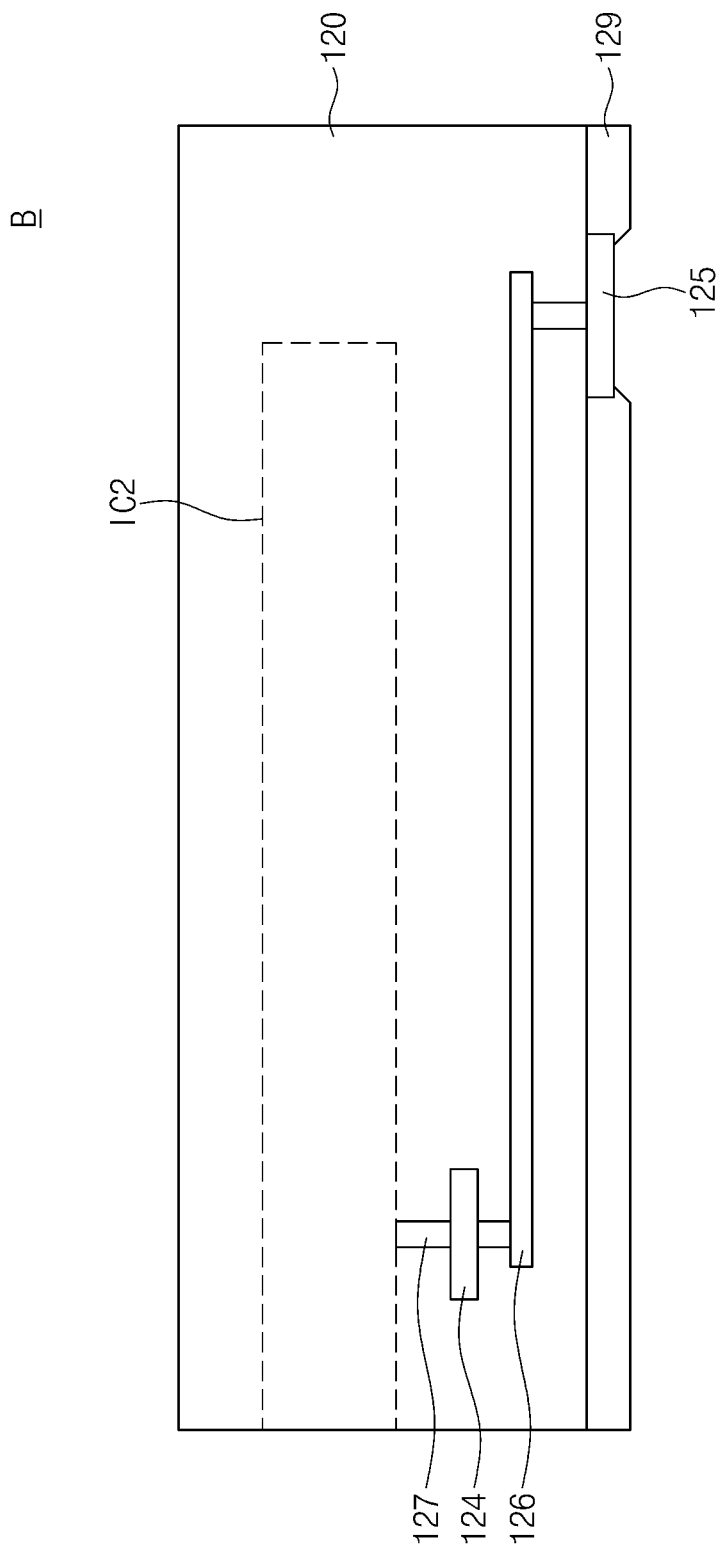

Referring to FIGS. 13A through 13C, the semiconductor package 11 may include a package substrate 100 with a circuit pattern 102, a first semiconductor chip 110 provided on the package substrate, and a pair of second semiconductor chips 120 provided on the first semiconductor chip and spaced apart from each other.

The package substrate 100 may be a printed circuit board. The package substrate 100 may include the circuit pattern 102. The circuit pattern 102 may be electrically connected to an external pad 104, which may be provided on a bottom surface 100a of the package substrate 100. To electrically connect the semiconductor package 6 to an external device, at least one external terminal 108 (e.g., a solder bump or a solder ball) may be provided on the external pad 104.

The first semiconductor chip 110 may include a first surface 110a facing the package substrate 100 and a second surface 110b opposite the first surface 110a. The first semiconductor chip 110 may include a first integrated circuit IC1, through-silicon vias TSV, and a first bonding pad 115. The first integrated circuit IC1 may be formed in the first semiconductor chip 110 adjacent to the first surface 110a.

The through-silicon vias TSV may be disposed in a central region of the first semiconductor chip 110. The through-silicon vias TSV may be formed to penetrate the first semiconductor chip 110 or a substrate thereof. The first semiconductor chip 110 may include a lower pad 111a and an upper pad 111b, which are provided on the first and second surfaces 110a and 110b, respectively, and are connected to each other by the through-silicon vias TSV.

The first bonding pads 115 may be provided in the central region of the first semiconductor chip 110 but spaced apart from the through-silicon vias TSV. The first bonding pads 115 may be disposed on the first surface 110a of the first semiconductor chip 110. Each first bonding pad 115 may be electrically connected to the first integrated circuit IC1 via a first contact 117 and a first internal pad 118. The first bonding pads 115 may be disposed adjacent to the through-silicon vias TSV. Each first bonding pad 115 may be electrically connected to a corresponding one of the through-silicon vias TSV via a first redistributed line 116.

First bumpers 22 may be provided between the first semiconductor chip 110 and the package substrate 100 to electrically connect the first bonding pads 115 to the circuit pattern 102. First dummy bumpers 24 may additionally be provided between the first semiconductor chip 110 and the package substrate 100 and spaced apart from the first bumpers 22.

A first insulating layer 119 may be provided on the first surface 110a of the first semiconductor chip 110 to cover the first surface 110a and expose the first bonding pads 115.

A pair of second semiconductor chips 120 may be provided spaced apart from each other to expose the central region of the first semiconductor chip 110. Opposite edge portions 120e of the second semiconductor chips 120 may be disposed adjacent to the central region of the first semiconductor chip 110. Each of the second semiconductor chips 120 may include a third surface 120a facing the first semiconductor chip 110 and a fourth surface 120b opposite the third surface 120a. Each second semiconductor chip 120 may include a second integrated circuit IC2, a second center pad 124, and a second bonding pad 125.

The second integrated circuits IC2 may be formed in the second semiconductor chips 120 adjacent to the third surfaces 120a. The second center pads 124 may be provided in the central regions of the second semiconductor chips 120.

The second bonding pads 125 may be disposed adjacent to edge portions 120e of the second semiconductor chips 120. The second center pads 124 and the second bonding pads 125 may be provided on the third surfaces 120a of the second semiconductor chips 120. The second bonding pads 125 may be electrically connected to the second center pads 124 via second redistributed lines 126. The second center pads 124 may be electrically connected to the second integrated circuits IC2 via second contacts 127. Second insulating layers 129 may be provided on the third surfaces 120a of the second semiconductor chips 120 to cover the third surfaces 120a and expose the second bonding pads 125.

Second bumpers 26 may be provided between the first semiconductor chip 110 and the second semiconductor chips 120 to connect the second bonding pads 125 to the upper pad 111b. Second dummy bumpers 28 may additionally be provided between the first semiconductor chip 110 and the second semiconductor chips 120, spaced apart from the second bumpers 26.

A semiconductor package 12 according to a twelfth embodiment of the inventive concepts will now be described with reference to FIG. 14. Discussion of features identical to those of FIGS. 13A through 13C will be minimized to avoid redundancy.

Figure 14:
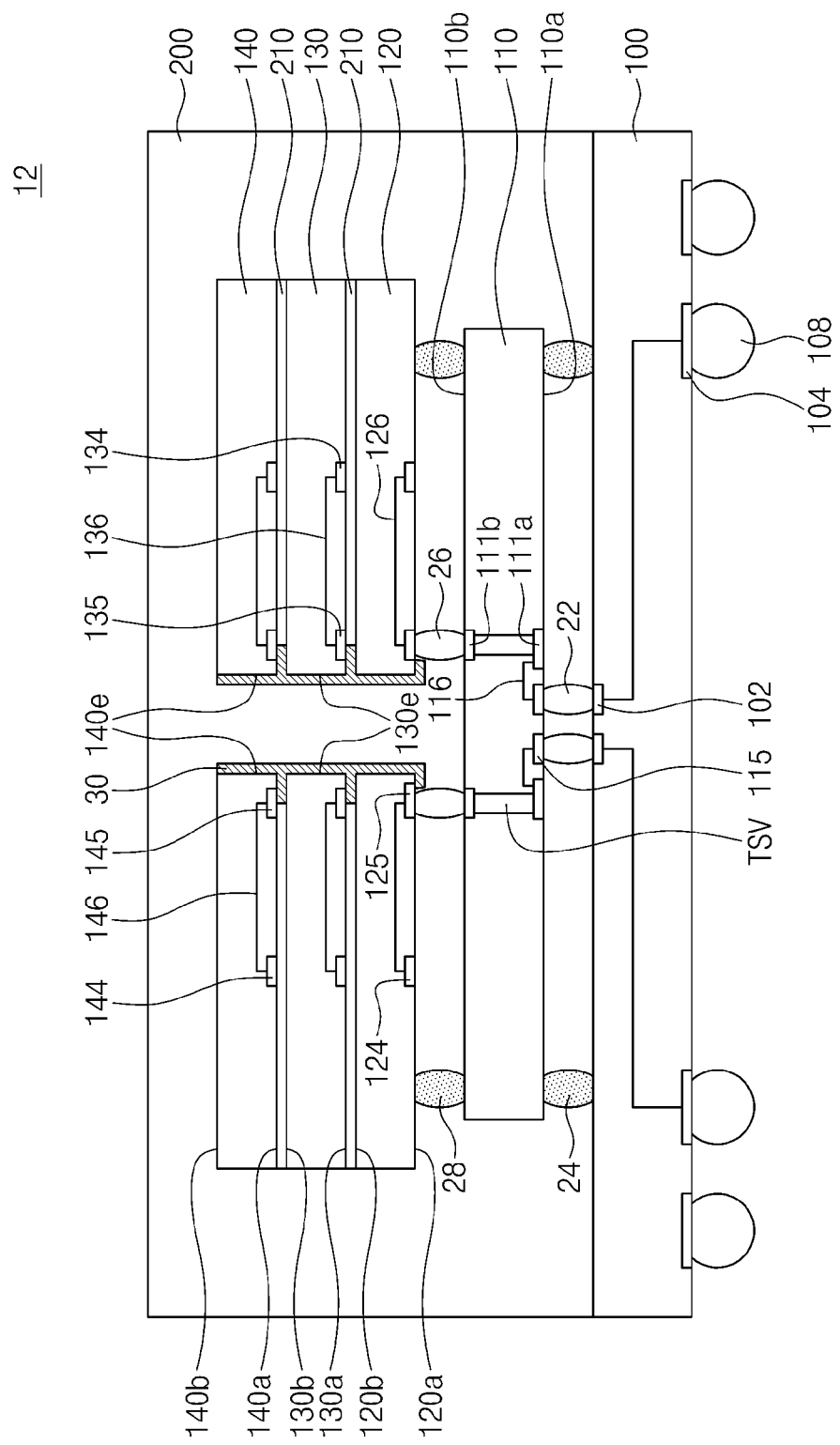
FIG. 14 is a sectional view of a semiconductor package according to a twelfth embodiment of the inventive concepts.

Referring to FIG. 14, a semiconductor package 12 according to this embodiment may include a package substrate 100, a first semiconductor chip 110 on the package substrate 100, a pair of second semiconductor chips 120 spaced apart from each other and disposed between the package substrate 100 and the first semiconductor chip 110. In addition, the semiconductor package 12 may include a pair of third semiconductor chips 130 spaced apart from each other and disposed on the second semiconductor chips 120, and a pair of fourth semiconductor chips 140 spaced apart from each other and disposed on the third semiconductor chips 130.

One or more of the third semiconductor chips 130 may include a third integrated circuit, a third center pad 134, and a third bonding pad 135. The third bonding pads 135 may be electrically connected to the third integrated circuits. The third semiconductor chips 130 may each include a fifth surface 130a facing a corresponding second semiconductor chip 120 and a sixth surface 130b opposite the fifth surface 130a.

Similar to the second integrated circuit IC2 shown in FIG. 13C, the third integrated circuit may be provided in the third semiconductor chip 130 adjacent to the fifth surface 130a. The third center pads 134 and the third bonding pads 135 may be provided on the fifth surfaces 130a of the third semiconductor chips 130. The third center pads 134 may be provided in central regions of the third semiconductor chips 130. The third bonding pads 135 may be disposed adjacent to edge portions 130e of the third semiconductor chips 130. The third bonding pads 135 may be provided to correspond to the second bonding pads 125 and be electrically connected to the third center pads 134 via third redistributed lines 136. Accordingly, the third bonding pads 135 may be electrically connected to the third integrated circuits via the third center pads 134.

One or more of the fourth semiconductor chips 140 may include a fourth integrated circuit, a fourth center pad 144, and a fourth bonding pad 145. In example embodiments, the fourth bonding pads 145 may be provided at edge portions 140e of the fourth semiconductor chips 140 to be arranged adjacent to each other. The fourth semiconductor chips 140 may each include a seventh surface 140a facing a corresponding third semiconductor chip 130 and an eighth surface 140b opposite the seventh surface 140a.

Similar to the second integrated circuit IC2 shown in FIG. 13C, the fourth integrated circuit may be provided in the fourth semiconductor chip 140 adjacent to the seventh surface 140a. The fourth center pads 144 and the fourth bonding pads 145 may be provided on the seventh surfaces 140a of the fourth semiconductor chips 140. The fourth center pads 144 may be provided in central regions of the fourth semiconductor chips 140. The fourth bonding pads 145 may be disposed adjacent to edge portions 140e of the fourth semiconductor chips 140. The fourth bonding pads 145 may be provided to correspond to the third bonding pads 135 and be electrically connected to the fourth center pads 144 via the fourth redistributed lines 146. Accordingly, the fourth bonding pads 145 may be electrically connected to the fourth integrated circuits via the fourth center pads 144.

The second semiconductor chips 120, third semiconductor chips 130, and fourth semiconductor chips 140 may be attached to each other by adhesive layers 210.

The second bonding pads 125, the third bonding pads 135, and the fourth bonding pads 145 may be connected to each other in a side connection manner, as described previously with respect to FIG. 10.

A semiconductor package 13 according to a thirteenth embodiment of the inventive concepts will now be described with reference to FIG. 15. Discussion of features identical to those of FIG. 14 will be minimized to avoid redundancy.

Figure 15:
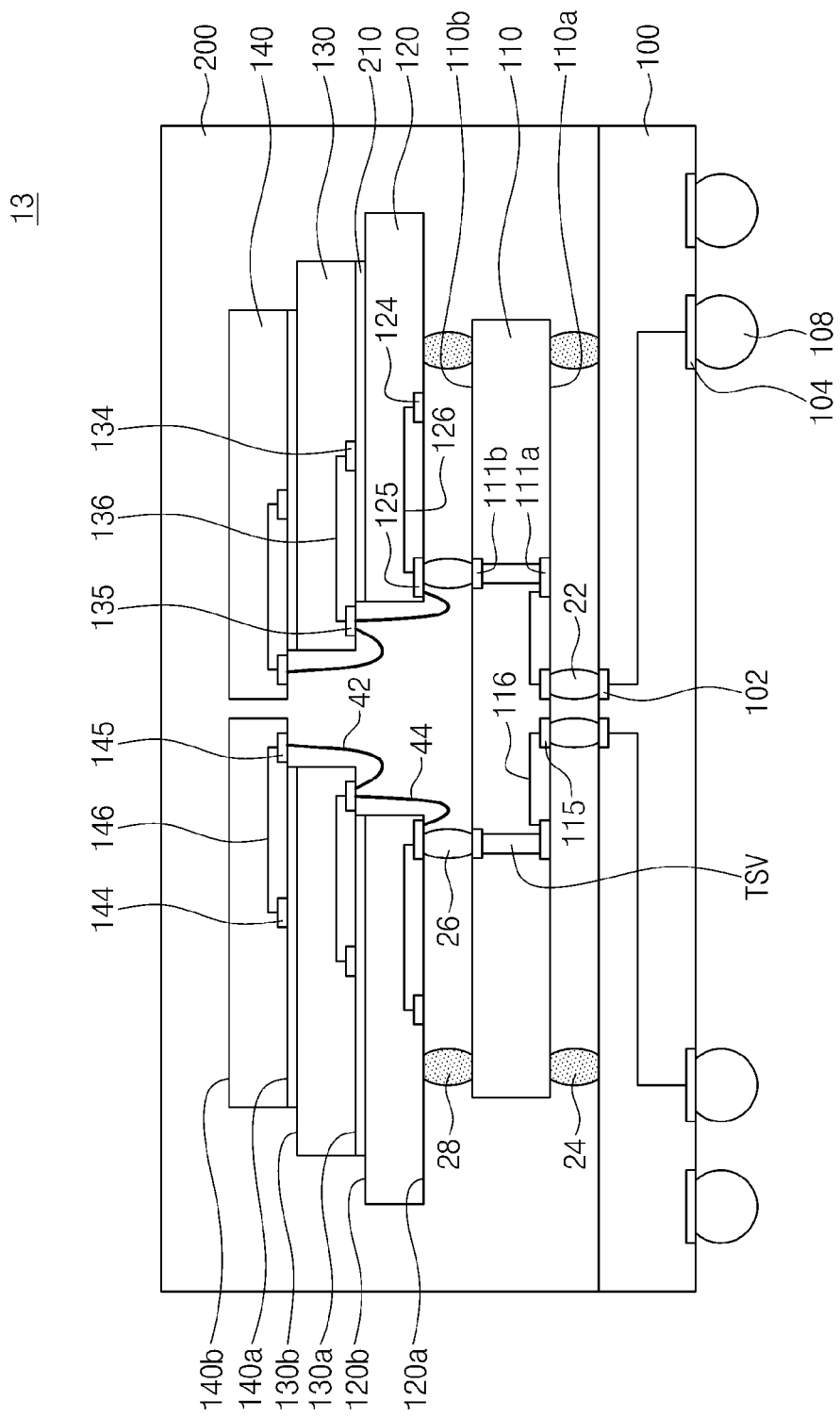
FIG. 15 is a sectional view of a semiconductor package according to a thirteenth embodiment of the inventive concepts.

Referring to FIG. 15, unlike the embodiment shown in FIG. 14, the third semiconductor chips 130 of this embodiment may be shifted toward the center of the package substrate 100 to expose the third bonding pads 135 of the third semiconductor chips 130, and the fourth semiconductor chips 140 may be shifted toward the center of the package substrate 100 to expose the fourth bonding pads 145 of the fourth semiconductor chips 140.

The second and third bonding pads 125 and 135, respectively, may be connected to each other by first subwires 42, and the third and fourth bonding pads 135 and 145, respectively, may be connected to each other by second subwires 44.

According to the eleventh, twelfth, and thirteenth embodiments described above, the first integrated circuit IC1 of the first semiconductor chip 110 may be formed in the first semiconductor chip 110 adjacent to the first surface 110a, and the first bonding pads 115 may be provided on the first surface 110a of the first semiconductor chip 110. However, the inventive concepts are not limited to this configuration. For example, these embodiments may be modified in such a way that the first integrated circuit IC1 of the first semiconductor chip 110 is formed in the first semiconductor chip 110 adjacent to the second surface 110b and the first bonding pads 115 are provided on the second surface 110b of the first semiconductor chip 110, similar to the embodiment described with reference to FIGS. 8A and 8B.

According to the third through thirteenth embodiments described above, the bonding pads may be connected to the center pads, but the inventive concepts are not limited thereto. For example, these embodiments may be modified in such a way that the integrated circuit is directly connected to the edge pads (i.e., bonding pads) that are disposed adjacent to an edge portion of the semiconductor chip, without the center pads or without the use of the center pads, as described with respect to the second embodiment described shown in FIGS. 3A through 3E.

According to the fourth, fifth, sixth, tenth, and thirteenth embodiments described above, bonding pads may be connected by bonding wires including subwires, but the inventive concepts are not limited thereto. For example, these embodiments may be modified in such a way that the bonding pads may be connected by a side connection manner, as described, for example, with reference to FIG. 11.

Figure 16:
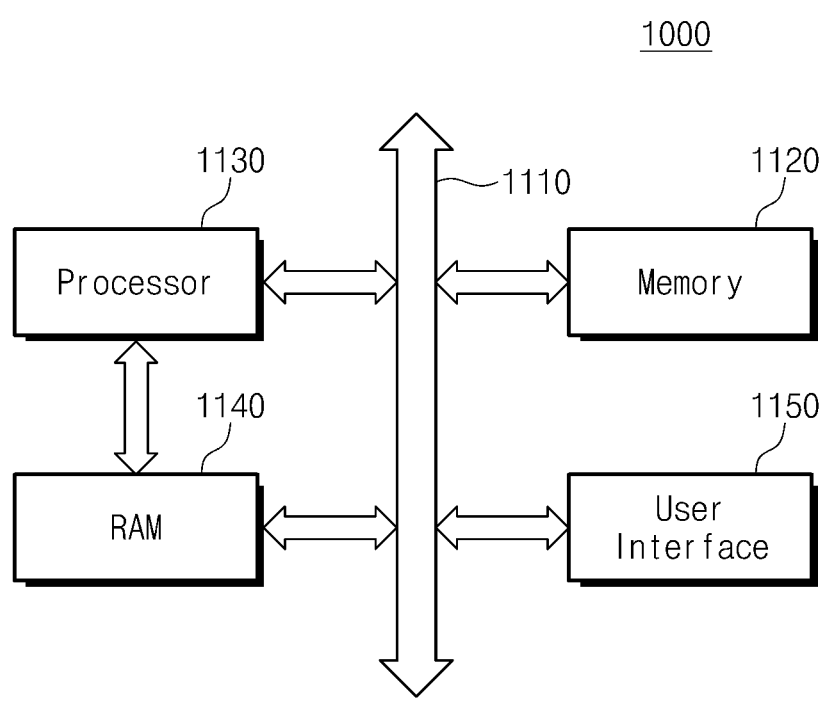
FIG. 16 is a block diagram illustrating an electronic system according to example embodiments of the inventive concepts.

FIG. 16 is a block diagram illustrating an electronic system 1000 according to example embodiments of the inventive concepts. Referring to FIG. 16, the electronic system 1000 may include at least one of the semiconductor packages according to the embodiments mentioned above. The electronic system 1000 may include a mobile device or a computer. As an illustration, the electronic system 1000 may include a memory system 1120, a processor 1130, a random access memory (RAM) 1140, and a user interface 1150 that that are electrically connected to a bus 1110. The processor 1130 may be configured to execute programs and control the electronic system 1000. The RAM 1140 may be used as an operating memory of the processor 1130. For example, all or each of the memory system 1120, the processor 1130, and the RAM 1140 may include the semiconductor package according to example embodiments of the inventive concepts. Alternatively, the processor 1130 and the RAM 1140 may be provided as components of a semiconductor package. The user interface 1150 may be used to input/output data to/from the electronic system 1000. The memory system 1120 may be configured to store code for operating the processor 1130, data processed by the processor 1130 or data inputted from the outside.

The electronic system 1000 of FIG. 16 may be applied to various electronic devices or systems. For example, the electronic system 1000 of FIG. 16 may be applied to a mobile system (e.g., a smartphone), a portable notebook, a MP3 player, a navigation system, a solid state disk (SSD), a server system, a vehicle, or household appliances.

According to example embodiments of the inventive concepts, semiconductor chips may be connected to each other via bonding wires that are provided through central regions thereof, and thus, the semiconductor package can be fabricated with low cost. Slave chips may be connected to the outside through a master chip, and this makes it possible to improve electric characteristics of the package.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:
   a package substrate comprising:
      an opening arranged in a central region thereof; and
      a circuit pattern arranged adjacent to the opening in the package substrate;
   a first semiconductor chip arranged over the package substrate, the first semiconductor chip comprising:
      a first integrated circuit,
      a first center pad disposed in a central region of the first semiconductor chip, the first center pad being arranged over the opening and electrically connected to the circuit pattern by a first wire; and
      a plurality of first bonding pads, each first bonding pad being disposed in the central region of the first semiconductor chip and spaced apart from the first center pad, the first bonding pads being electrically connected to the first integrated circuit;
   a pair of second semiconductor chips mounted between the package substrate and the first semiconductor chip, the second semiconductor chips being spaced apart from each other on opposite sides of the opening, the second semiconductor chips each comprising:
      a second integrated circuit; and
      a plurality of second bonding pads, wherein the second bonding pads are arranged adjacent to an edge portion of each of the second semiconductor chips and proximal to corresponding ones of the first bonding pads, and wherein the second bonding pads are electrically connected to the second integrated circuit; and
   a connection element electrically connecting the first bonding pads to the second bonding pads,
   wherein the first semiconductor chip has a memory capacity that is about two times that of each of the second semiconductor chips, and wherein a total memory capacity of the package is about $2^n$ times a memory capacity of the first semiconductor chip, where n is an integer.

2. The semiconductor package of claim 1, wherein the first center pad is electrically connected to the first bonding pads via the first integrated circuit.

3. The semiconductor package of claim 1, wherein the first semiconductor chip has a first surface facing the package substrate and a second surface opposite the first surface, and wherein the first center pad and the first bonding pads are disposed on the first surface, and
   wherein each of the second semiconductor chips has a third surface facing the first surface of the first semiconductor chip and a fourth surface opposite the third surface, and wherein the second bonding pads are disposed on the third surface.

4. The semiconductor package of claim 3, wherein each of the second semiconductor chips further comprise second center pads disposed in central regions thereof, wherein the second center pads are electrically connected to a corresponding second integrated circuit, and wherein each of the second center pads is electrically connected to a corresponding one or more of the second bonding pads via a second redistributed layer.

5. The semiconductor package of claim 3, wherein the second integrated circuit is electrically connected to corresponding ones of the second bonding pads, without second center pads being provided in the central regions of the second semiconductor chips.

6. The semiconductor package of claim 3, further comprising:
   a pair of third semiconductor chips spaced apart from each other on opposite sides of the opening and arranged between the package substrate and the second semiconductor chips, each of the third semiconductor chips comprising:
      a third integrated circuit; and
      a third bonding pad located at an edge portion of each of the third semiconductor chips adjacent to the opening and being electrically connected to the third integrated circuit; and
   a pair of fourth semiconductor chips spaced apart from each other on opposite sides of the opening and arranged between the package substrate and the third semiconductor chips, each of the fourth semiconductor chips comprising:
      a fourth integrated circuit; and
      a fourth bonding pad located at an edge portion of each of the fourth semiconductor chips adjacent to the opening and being electrically connected to the fourth integrated circuit,
   wherein corresponding ones of the second bonding pads, the third bonding pads, and the fourth bonding pads are connected to each other in a side connection manner or a wire connection manner.

7. The semiconductor package of claim 6, wherein each of the third semiconductor chips has a fifth surface facing a corresponding second semiconductor chip and a sixth surface opposite the fifth surface, and wherein the third bonding pads are disposed on the fifth surfaces, and
   wherein each of the fourth semiconductor chips has a seventh surface facing the sixth surface of a corresponding third semiconductor chip and an eighth surface opposite the seventh surface, and wherein the fourth bonding pads are disposed on the seventh surfaces.

8. The semiconductor package of claim 3, wherein the connection element comprises first bumpers disposed between the first semiconductor chip and the second semiconductor chips.

9. The semiconductor package of claim 1, wherein the first semiconductor chip has a first surface facing the package substrate and a second surface opposite the first surface, and wherein the first center pad and the first bonding pads are disposed on the first surface, and
   wherein each of the second semiconductor chips has a third surface facing the first surface of the first semiconductor chip and a fourth surface opposite the third surface, and wherein the second bonding pads are disposed on the fourth surfaces.

10. The semiconductor package of claim 9, wherein the connection element comprises a second wire,
    wherein the second semiconductor chips are shifted toward the opening of the package substrate to expose the second bonding pads of the second semiconductor chips, and
    wherein the first bonding pads are exposed over the opening.

11. The semiconductor package of claim 9, further comprising:
    a pair of third semiconductor chips spaced apart from each other and arranged between the package substrate and the second semiconductor chips, each of the third semiconductor chips comprising:
       a third integrated circuit; and
       a third bonding pad, arranged on an edge portion of each of the third semiconductor chips proximal to the opening, the third bonding pad being electrically connected to the third integrated circuit; and a pair of fourth semiconductor chips spaced apart from each other and arranged between the package substrate and the third semiconductor chips, each of the fourth semiconductor chips comprising:
  a fourth integrated circuit; and
  a fourth bonding pad, arranged on an edge portion of each of the fourth semiconductor chips proximal to the opening, the fourth bonding pad being electrically connected to the fourth integrated circuit.

12. The semiconductor package of claim 11, wherein each of the third semiconductor chips has a fifth surface facing a corresponding second semiconductor chip and a sixth surface opposite the fifth surface, and wherein the third bonding pad and the third integrated circuit are disposed on the sixth surface, and
  wherein each of the fourth semiconductor chips has a seventh surface facing the sixth surface of a corresponding third semiconductor chip and an eighth surface opposite the seventh surface, and wherein the fourth bonding pad and the fourth integrated circuit are disposed on the eighth surface.

13. The semiconductor package of claim 12, wherein the third semiconductor chips are shifted toward the opening of the package substrate to expose the third bonding pads of the third semiconductor chips,
  wherein the fourth semiconductor chips are shifted toward the opening of the package substrate to expose the fourth bonding pads of the fourth semiconductor chips,
  wherein corresponding second and third bonding pads are connected to each other by a third wire, and
  wherein corresponding third and fourth bonding pads are connected to each other by a fourth wire.

* * * * *